(12) United States Patent
Yamauchi et al.

(10) Patent No.: US 11,437,958 B2
(45) Date of Patent: Sep. 6, 2022

(54) POWER AMPLIFYING DEVICE AND AUDIO SYSTEM

(71) Applicants: Kabushiki Kaisha Toshiba, Tokyo (JP); Toshiba Electronic Devices & Storage Corporation, Tokyo (JP)

(72) Inventors: Akira Yamauchi, Yokohama Kanagawa (JP); Hiroyuki Tsurumi, Fujisawa Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 62 days.

(21) Appl. No.: 17/018,287

(22) Filed: Sep. 11, 2020

(65) Prior Publication Data
US 2021/0297045 A1    Sep. 23, 2021

(30) Foreign Application Priority Data

Mar. 23, 2020  (JP) .............................. JP2020-051585

(51) Int. Cl.
*H03F 99/00*  (2009.01)
*H03F 1/02*   (2006.01)
*H03F 3/45*   (2006.01)
*H04R 3/12*   (2006.01)
*H04R 1/40*   (2006.01)

(52) U.S. Cl.
CPC ....... *H03F 1/0211* (2013.01); *H03F 3/45179* (2013.01); *H04R 1/403* (2013.01); *H04R 3/12* (2013.01); *H03F 2200/03* (2013.01)

(58) Field of Classification Search
CPC ....................................................... H03F 99/00
See application file for complete search history.

(56) References Cited

U.S. PATENT DOCUMENTS

| 6,107,886 | A  | 8/2000  | Kusakabe et al. |
| 6,330,539 | B1 | 12/2001 | Takayama et al. |
| 7,813,515 | B2 | 10/2010 | Botti et al.    |

(Continued)

FOREIGN PATENT DOCUMENTS

| JP | 2007-104576 |    | 4/2007 |
| JP | 4154601     | B1 | 4/2007 |

(Continued)

*Primary Examiner* — Olisa Anwah
(74) *Attorney, Agent, or Firm* — Allen & Overy LLP

(57) ABSTRACT

A power amplifying device according to an embodiment includes three or more BTL amplifiers and a closed loop section. The three or more BTL amplifiers include bridge-connected first and second output amplifiers and output a first output signal obtained by amplifying a first input signal. Switch circuits respectively corresponding to the three or more BTL amplifiers are connected in series in the closed loop section. The closed loop section is capable of forming a closed loop. An output terminal of the second output amplifier is connected to one end of the switch circuit corresponding to the second output amplifier. The switch circuit is turned on to establish connection between an output terminal of the first output amplifier and the output terminal of the second output amplifier and is turned off to break the connection between the output terminals.

20 Claims, 23 Drawing Sheets

(56) References Cited

U.S. PATENT DOCUMENTS

| | | | |
|---|---|---|---|
| 8,199,936 B2 | 6/2012 | Asada et al. | |
| 8,330,539 B2 * | 12/2012 | Hissink | H03F 3/602 330/146 |
| 9,602,070 B2 | 3/2017 | Tsurumi | |
| 2020/0162040 A1 | 5/2020 | Yamauchi et al. | |

FOREIGN PATENT DOCUMENTS

| | | |
|---|---|---|
| JP | H11-284450 A | 9/2008 |
| JP | 6360453 B1 | 7/2018 |
| JP | 2020-088530 A | 6/2020 |

* cited by examiner

| ch1 | ch2 | ch3 | ch4 | EFFICIENCY WITH RESPECT TO AB CLASS | FIGURE NUMBER |
|---|---|---|---|---|---|
| 0 | 0 | A | A | DOUBLE | 18 |
| 0 | 0 | -A | -A | DOUBLE | |
| 0 | A | 0 | A | DOUBLE | 14 |
| 0 | A | -A | 0 | DOUBLE | |
| 0 | -A | 0 | -A | DOUBLE | |
| 0 | -A | A | 0 | DOUBLE | |
| 0 | 0 | A | 0 | DOUBLE | |
| A | 0 | 0 | A | DOUBLE | 16 |
| A | A | A | -A | DOUBLE | 8 |
| A | A | -A | A | DOUBLE | |
| A | 0 | 0 | 0 | DOUBLE | |
| -A | 0 | -A | 0 | DOUBLE | |
| -A | A | 0 | A | DOUBLE | |
| -A | -A | A | 0 | DOUBLE | 9 |
| -A | -A | -A | A | DOUBLE | |
| -A | -A | -A | -A | DOUBLE | |

0 : NO SIGNAL.
A : SMALL AMPLITUDE, POSITIVE POLARITY
-A : SMALL AMPLITUDE, NEGATIVE POLARITY

FIG. 13

POWER AMPLIFYING DEVICE AND AUDIO SYSTEM

CROSS-REFERENCE TO RELATED APPLICATIONS

This application is based upon and claims the benefit of priority from the prior Japanese Patent Application No, 2020-051585, filed on Mar. 23, 2020; the entire contents of which are incorporated herein by reference.

FIELD

Embodiments of the present invention relate to a power amplifying device and an audio system.

BACKGROUND

Power amplifying devices for car audio equipment typically have a class-B or class-AB bridge circuit configuration and are installed in a limited space. The car audio equipment has problems in that it is difficult to install a large heat radiating device, such as a radiator fin, and semiconductor devices of the audio equipment are damaged by heat and have a reduced life time. Recent car audio equipment tends to have higher power and more channels and to be multimedia-ready. In this trend, there is an increasing demand for a high-efficiency power amplifier system that generates less heat.

One of common on-vehicle power amplifying devices having a single power supply rail is a power amplifying device of a so-called multi-stage lateral configuration. However, in the multi-stage lateral configuration, a switch circuit for exchanging an electric current between output amplifiers is necessary. The switch circuit needs to supply small to medium power during a small signal mode (high-efficiency operation), Therefore, a switch circuit having a power capacity for enabling treatment of electric power corresponding to the small to medium power is necessary.

BRIEF DESCRIPTION OF THE DRAWINGS

FIG. 13 is a diagram showing a combination example of first to fourth input signals;

DETAILED DESCRIPTION

A power amplifying device according to an embodiment Includes three or more BTL amplifiers and a closed loop section. The three or more BTL amplifiers include bridge-connected first and second output amplifiers and output a first output signal obtained by amplifying a first input signal, Switch circuits respectively corresponding to the three or more BTL amplifiers are connected in series in the closed loop section. The closed loop section is capable of forming a closed loop. An output terminal of the second output amplifier is connected to one end of the switch circuit corresponding to the second output amplifier. The switch circuit is turned on to establish connection between an output terminal of the first output amplifier and the output terminal of the second output amplifier and is turned off to break the connection between the output terminals.

Embodiments of the present invention are explained below with reference to the drawings. In the accompanying drawings, for illustration and easiness of understanding, scales, aspect ratios, and the like are changed from actual ones and exaggerated as appropriate.

Embodiment

Figure 1:
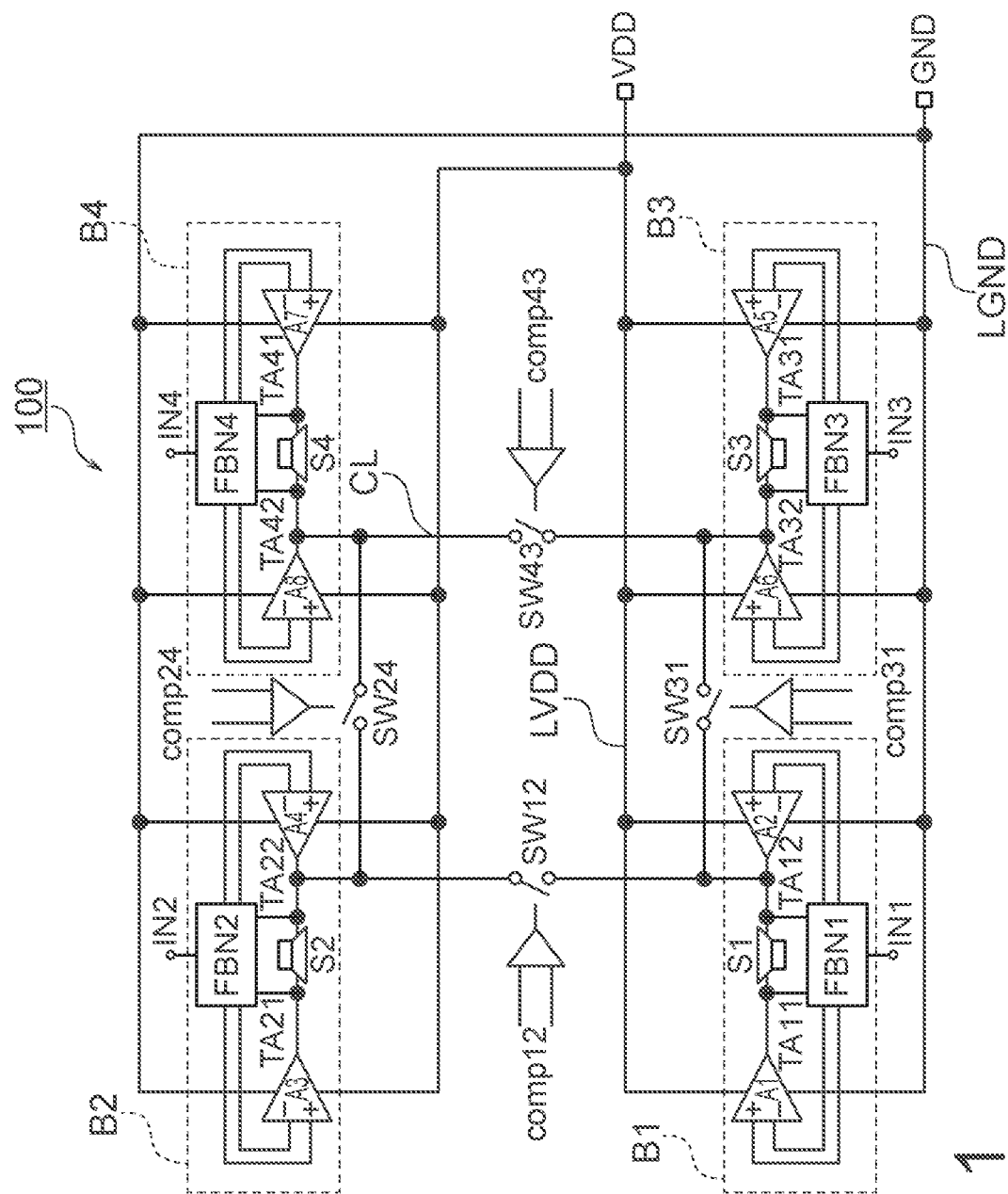
FIG. 1 is a configuration diagram showing an example of an audio system including a power amplifying device.

FIG. 1 is a configuration diagram showing an example of an audio system including a power amplifying device 100 according to an embodiment. The power amplifying device 100 includes a first potential line LVDD, a second potential line LGND, first to fourth BTL amplifiers 61 to 64, a closed loop section CL, first to fourth control circuits FBN1 to FBN4, and first to fourth comparators Comp12, Comp24, Comp31, and Comp43.

First potential (a power supply voltage) VDD is supplied to the first potential line LVDD. Second potential GND lower than the first potential VDD is supplied to the second potential line LGND. To simplify explanation, the second potential according to this embodiment is treated as GND=0.

Each of the first to fourth BTL amplifiers B1 to 64 includes two amplifiers of a BTL (Bridge Tied Load or Balanced Transless) type in which output-stage transistors include bridge-connected output bridge circuits.

The first BTL amplifier B1 includes bridge-connected output amplifiers A1 and A2. The output amplifiers A1 and A2 include current source terminals, current sink terminals, and output terminals TA11 and TA12. A speaker S1, which is a load, is connected between the output terminals TA11 and TA12. The first BTL amplifier B1 outputs a first output signal obtained by amplifying the first input signal (a signal in a first channel Ch1) input to an input terminal IN1. The first output signal is output (a load current flows) to between the output terminals TA11 and TA12, whereby sound corresponding to the first input signal is output from the speaker S1.

The second BTL amplifier 62 includes bridge-connected output amplifiers A3 and A4. The output amplifiers A3 and A4 include current source terminals, current sink terminals, and output terminals TA21 and TA22. A speaker 52, which is a load is connected between the output terminals TA21 and TA22 of the output amplifiers A3 and A4. The second BTL amplifier 62 outputs a second output signal obtained by amplifying the second input signal (a signal in a second channel Ch2) input to an input terminal IN2. The second output signal is output (a load current flows) to between the output terminals TA21 and TA22 of the output amplifiers A3 and A4, whereby sound corresponding to the second input signal is output from the speaker 52.

The third BTL amplifier B3 includes bridge-connected output amplifiers A5 and A6. The output amplifiers A5 and A6 include current source terminals, current sink terminals, and output terminals TA31 and TA32. A speaker S3, which is a load, is connected between the output terminals TA31 and TA32 of the output amplifiers A5 and A6, The third BTL amplifier 63 outputs a third output signal obtained by amplifying the third input signal (a signal in a third channel Ch3) input to an input terminal IN3, The third output signal is output (a load current flows) to between the output terminals TA5 and TA6 of the output amplifiers A5 and A6, whereby sound corresponding to the third input signal is output from the speaker S3.

The fourth BTL amplifier B4 includes bridge-connected output amplifiers A7 and A8. The output amplifiers A7 and A8 Include current source terminals, current sink terminals, and output terminals TA7 and A8. A speaker S4, which is a load, is connected between the output terminals TA7 and A8 of the output amplifiers A7 and A8. The fourth BTL amplifier B4 outputs a fourth output signal obtained by amplifying the fourth input signal (a signal in a fourth channel Ch4) input to an input terminal IN4, The fourth output signal is output (a load current flows) to between the output terminals TA7 and A8 of the output amplifiers A7 and A8, whereby sound corresponding to the fourth input signal is output from the speaker S4.

The closed loop section CL includes first to fourth switch circuits SW12, SW24, SW31, and SW43 connected in series. The closed loop section CL is capable of forming a closed loop, That is, the closed loop section CL forms the closed loop when all of the first to forth switch circuits SW12, SW24, SW31, and SW43 are on. The first to fourth switch circuits SW12, SW24, SW31, and SW43 can be configured by, for example, an n-type transistor.

The output terminal TA12 of the output amplifier A2 is connected to one end of the first switch circuit SW12, The output terminal TA22 of the output amplifier A4 is connected to the other end of the first switch circuit SW12, The output terminal TA22 of the output amplifier A4 is connected to one end of the second switch circuit SW24, The output terminal TA42 of the output amplifier A8 is connected to the other end of the second switch circuit SW24. The output terminal TA32 of the output amplifier A6 is connected to one end of the third switch circuit SW31. The output terminal TA12 of the output amplifier A2 is connected to the other end of the third switch circuit SW31, The output terminal TA42 of the output amplifier A8 is connected to one end of the fourth switch circuit SW43, The output terminal TA32 of the output amplifier A6 is connected to the other end of the fourth switch circuit SW43.

That is, the other end of the third switch circuit SW31 is connected to one end of the first switch circuit SW12. One end of the second switch circuit SW24 is connected to the other end of the first switch circuit SW12. The other end of the second switch circuit SW24 is connected to one end of the fourth switch circuit SW42, One end of the third switch circuit SW31 is connected to the other end of the fourth switch circuit SW42.

The first comparator Comp12 outputs a first control signal for controlling ON/OFF of the first switch circuit SW12, When both of the amplitudes of the first and second input signals are smaller than the first threshold Th1, the first comparator Comp12 outputs a signal for turning on the first switch circuit SW12, On the other hand, when at least one of the amplitudes of the first and second input signals is equal to or larger than the first threshold Th1, the first comparator Comp12 outputs a signal for turning off the first switch circuit SW12, Note that the first threshold Th1 is the same value as the amplitudes of the first and second input signals corresponding to the time when the amplitudes of the first and second output signals are VDD/2. That is, when the amplitudes of the first and second input signals are smaller than the first threshold Th1, the amplitudes of the first and second output signals are smaller than VDD/2.

The second comparator Comp24 outputs a second control signal for controlling ON/OFF of the second switch circuit SW24, When both of the amplitudes of the second and fourth input signals are smaller than the first threshold Th1, the second comparator Comp24 outputs a signal for turning on the second switch circuit SW24. On the other hand, when at least one of the amplitudes of the second and fourth input signals is equal to or larger than the first threshold Th1, the second comparator Comp24 outputs a signal for turning off the second switch circuit SW24, Note that the first threshold Th1 is the same value as the amplitudes of the second and fourth input signals corresponding to the time when the amplitudes of the second and fourth output signals are VDD/2. That is, when the amplitudes of the second and fourth input signals are smaller than the first threshold Th1, the amplitudes of the second and fourth output signals are smaller than VDD/2.

The third comparator Comp31 outputs a third control signal for controlling ON/OFF of the third switch circuit SW31. When both of the amplitudes of the third and first input signals are smaller than the first threshold Th1, the third comparator Comp31 outputs a signal for turning on the third switch circuit SW31. On the other hand, when at least one of the amplitudes of the third and first input signals is equal to or larger than the first threshold Th1, the third comparator Comp31 outputs a signal for turning off the third switch circuit SW31. Note that the first threshold Th1 is the same value as the amplitudes of the third and first input signals corresponding to the time when the amplitudes of the third and first output signals are VDD/2. That is, when the amplitudes of the third and first input signals are smaller than the first threshold Th1, the amplitude of the third and first input and output signals are smaller than VDD/2.

The fourth comparator Comp43 outputs a fourth control signal for controlling ON/OFF of the fourth switch circuit SW43. When both of the amplitudes of the fourth and third input signals are smaller than the first threshold Th1, the fourth comparator Comp43 outputs a signal for turning on the fourth switch circuit SW43, On the other hand, when at least one of the amplitudes of the fourth and third input signals is equal to or larger than the first threshold Th1, the fourth comparator Comp43 outputs a signal for turning off the fourth switch circuit SW43. Note that the first threshold Th1 is the same value as the amplitudes of the fourth and third input signals corresponding to the time when the amplitudes of the fourth and third output signals are VDD/2. That is, when the amplitudes of the fourth and third input signals are smaller than the first threshold Th1, the amplitudes of the fourth and third input and output signals are smaller than VDD/2.

According to the first control signal, the first switch circuit SW12 is turned on to establish connection between the output terminals TA12 and TA22 or is turned off to break the connection between the output terminals TA12 and TA22. According to the second control signal, the second switch circuit SW24 is turned on to establish connection between the output terminals TA22 and TA42 or is turned off to break the connection between the output terminals TA22 and TA42. According to the third control signal, the third switch circuit SW31 is turned on to establish connection between the output terminals TA12 and TA32 or is turned off to break the connection between the output terminals TA12 and TA32. According to a fourth control signal, the fourth switch circuit SW43 is turned on to establish connection between the output terminals TA32 and TA42 or is turned off to break the connection between the output terminals TA32 and TA42.

The respective first to fourth BTL amplifiers 61 to B4 change to a mode called small signal mode if the amplitudes of the first to fourth input signals corresponding thereto are smaller than the first threshold Th1. On the other hand, the respective first to fourth BTL amplifiers 61 to 64 change to a mode called large signal mode if the amplitudes of the first to fourth input signals corresponding thereto are equal to or larger than the first threshold Th1.

The first switch circuit SW12 is turned on if the first BTL amplifier B1 and the second BTL amplifier B2 are in the snail signal mode and is turned off if at least one of the first BTL amplifier B1 and the second BTL amplifier B2 is in the large signal mode.

The second switch circuit SW24 is turned on if the second BTL amplifier B2 and the fourth BTL amplifier B4 are in the small signal mode and is turned off if at least one of the second BTL amplifier B2 and the fourth BTL amplifier B4 is in the large signal mode.

The third switch circuit SW31 is turned on if the third BTL amplifier B3 and the first BTL amplifier B1 are in the small signal mode and is turned off if at least one of the third BTL amplifier B3 and the first BTL amplifier B1 is in the large signal mode.

The fourth switch circuit SW43 is turned on if the fourth BTL amplifier B4 and the third BTL amplifier B3 are in the small signal mode and is turned off if at least one of the fourth BTL amplifier B4 and the third BTL amplifier B3 is in the large signal mode.

That is, each of the respective first to fourth switch circuits SW12, SW24, SW31, and SW43 is turned off when the amplitude of an input signal of at least one of the two BTL amplifiers connected thereto is equal to or larger than the first threshold.

The first control circuit FBN11 controls gains of the output amplifiers A1 and A2 such that a differential gain of the first BTL amplifier B1 is a prescribed value. During the small signal mode, the first control circuit FBN11 controls a common mode voltage in the output amplifier A2 such that a common mode voltage of the output amplifiers A2, A4, A6, and A8, which is a reference output, is equal to third potential and output currents of the output amplifiers A2, A4, and A6 are equal. The third potential is set to, for example, VDD/2, which is intermediate potential between the first potential VDD and the second potential GND. Note that, in the small signal mode, so-called SEPP (Single Ended Push-Pull) control is performed.

When the first switch circuit SW12 and the third switch circuit SW31 are off in the large signal mode, as long as an output of the output amplifier A1 is not clipped, the first control circuit FBN1 performs control to hold the common mode voltage of the output amplifiers A1 and A2 immediately before the first switch circuit SW12 and the third switch circuit SW31 are turned off. Note that, in the large signal mode, so-called BTL (Balanced Transformer Less) control is performed.

The second control circuit FBN2 controls gains of the output amplifiers A3 and A4 such that a differential gain of the second BTL amplifier B2 is a prescribed value, During the small signal mode, the second control circuit FBN2 controls a common mode voltage of the output amplifier A4 such that the common mode voltage of the output amplifiers A2, A4, A6, and A8, which is the reference output, is equal to the third potential and output currents of the output amplifiers A2, A4, and AB are equal.

When the first switch circuit SW12 and the second switch circuit SW24 are off in the large signal mode, as long as an output of the output amplifier A3 is not clipped, the second control circuit FBN2 performs control to hold the output potentials of the output amplifiers A3 and A4 immediately before the first switch circuit SW12 and the second switch circuit SW24 are turned off.

The third control circuit FBN3 controls gains of the output amplifiers A5 and A6 such that a differential gain of the third BTL amplifier 63 is a prescribed value, During the small signal mode, the third control circuit FBN3 controls a common mode voltage of the output amplifier A6 such that the common mode voltage of the output amplifiers A2, A4, A6, and A8 which is the reference output, is equal to the third potential and output currents of the output amplifiers A2, A6, and A8 are equal.

When the third switch circuit SW31 and the fourth switch circuit SW43 are off in the large signal mode, as long as an output of the output amplifier A5 is not clipped, the third control circuit FBN3 performs control to hold the output potentials of the output amplifiers A5 and A6 immediately before the third switch circuit SW31 and the fourth switch circuit SW43 are turned off.

The fourth control circuit FBN4 controls gains of the output amplifiers A7 and A8 such that a differential gain of the fourth BTL amplifier B4 is a prescribed value. During the small signal mode, the fourth control circuit FBN4 controls a common mode voltage of the output amplifier A8 such that the common mode voltage of the output amplifiers A2, A4, A6, and A8, which is the reference output, is equal to the third potential and output currents of the output amplifiers A4, A6, and A8 are equal.

When the second switch circuit SW24 and the fourth switch circuit SW43 are off in the large signal mode, as long as an output of the output amplifier A7 is not clipped, the fourth control circuit FBN4 performs control to hold the output potentials of the output amplifiers A7 and A8 immediately before the second switch circuit SW24 and the fourth switch circuit SW43 are turned off.

The first to fourth control circuits FBN1 to FBN4 perform so-called SEPP (Single Ended Push-Pull) control in the small signal mode and perform so-called BTL (Balanced Transformer Less) control in the large signal mode.

Figure 2:
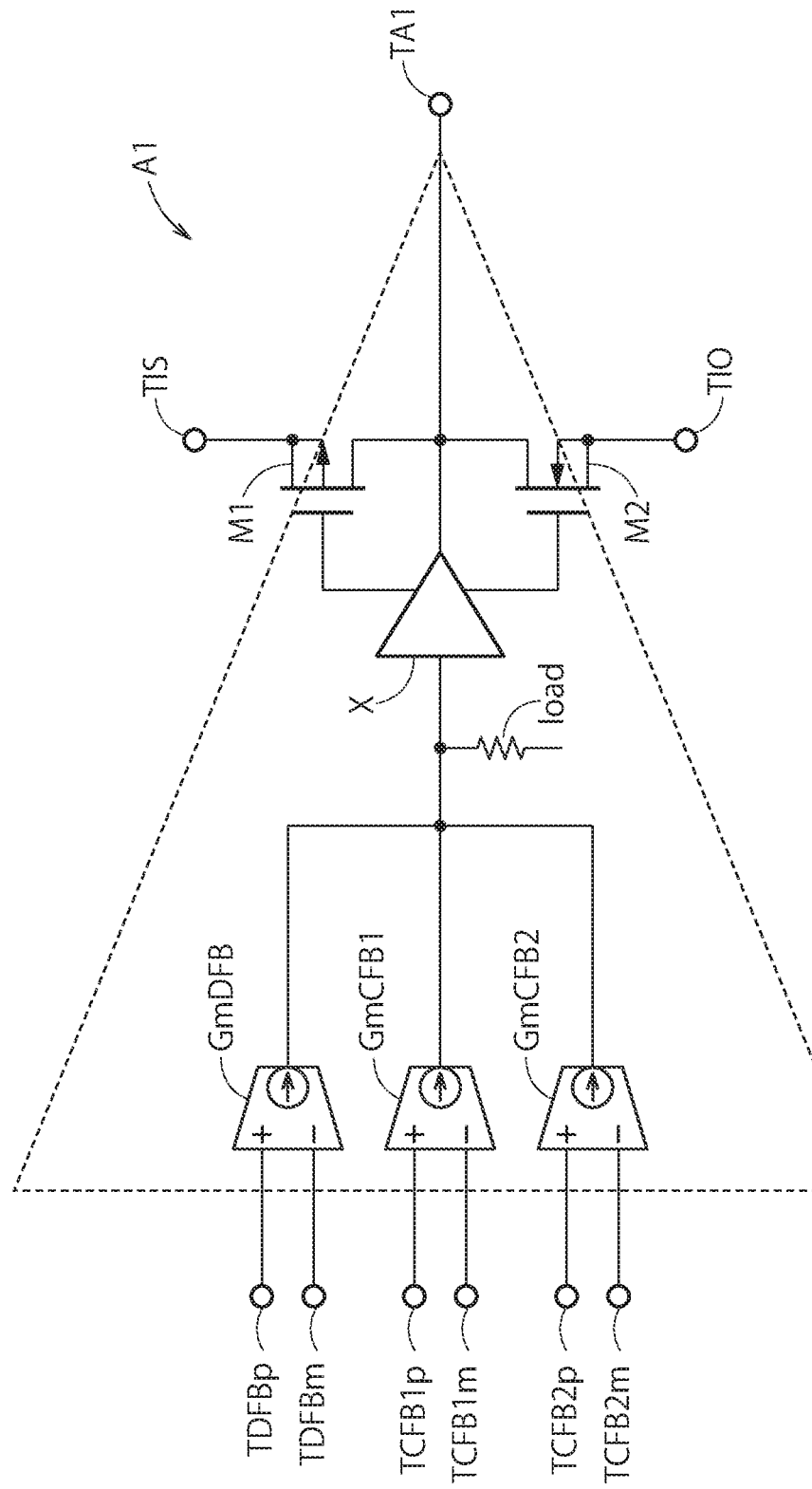
FIG. 2 is a diagram showing an example of the configuration of an output amplifier shown in FIG. 1.

Note that, when the first input signal is a no signal, the first control circuit FBN1 sets a DC voltage of the output terminals TA11 and TA12 to the third potential. When the second input signal is a no signal, the second control circuit FBN2 sets a DC voltage of the output terminals TA21 and TA22 to the third potential. When the third input signal is a no signal the third control circuit FBN3 sets a DC voltage of the output terminals TA31 and TA32 to the third potential. When the fourth input signal is a no signal, the fourth control circuit FBN4 sets a DC voltage of the output terminals TA41 and TA42 to the third potential, FIG. 2 is a configuration diagram showing an example of the output amplifier A1, Note that the other output amplifiers A2 to A8 have the same configuration. The output amplifier A1 shown in FIG. 2 includes differential input transconductance (gm) circuits GmDFB, GmCFB1, and GmCFB2, an internal load, a driver X, and a pMOS transistor M1 and an nMOS transistor M2 of a complementary type.

One end (a source) of a current path of the transistor M1 is connected to a current source terminal TIS and the other end (a drain) of the current path is connected to an output terminal TA1. One end (a drain) of a current path of the transistor M2 is connected to the output terminal TA1 and the other end (a source) of the current path is connected to a current sink terminal TIO. Current source is performed to the output terminal TA1 from the current source terminal TIS. An electric current flows from the output terminal TA1 to the current sink terminal TIO.

The gill circuit GmDFB outputs an electric current according to the potential difference between a first positive-phase input TDFBp and a first reverse-phase input TDFBm. The gm circuit GmCFB1 outputs an electric current according to the potential difference between a second positive-phase input TCFB1p and a second reverse-phase input TCFB1m. The gm circuit GmCFB2 outputs an electric current according to the potential difference between a third positive-phase input TCFB2p and a third reverse-phase input TCFB2m.

It is assumed that gms (transconductances) of the three gm circuits GmDFB, GmCFB1, and GmCFB2 are set to any values. Outputs of the gm circuits GmDFB, GmCFG1, and GmCFB2 are combined to drive the internal load. An 1-V converted output is further amplified by the driver X, The transistors M1 and M2, which have a push-pull configuration, are driven by an output of the driver X. Therefore, the transistors M1 and M2 are controlled by the gm circuits GmDFB, GmCFB1, and GmCFB2 to determine a voltage at the output terminal TA1.

In this embodiment, when the potential at a positive-phase input terminal is higher than the potential at a reverse-phase input terminal, the gm circuits operate to amplify the voltage at the output terminal to the positive-phase side. However, if the potential at a reverse-phase input of the gm circuits GmDFB, GmCFB1, and GmCFB2 is higher than the potential at a positive-phase input thereof, for example, the voltage at the load is determined by a sum of output currents of the gm circuits.

If the voltage at the load is amplified to the positive phase, the potential at the output terminal TA1 is also amplified to the positive phase. If the voltage at the load is amplified to the reverse phase, the potential at the output terminal TA1 is also amplified to the reverse phase, That is, the output amplifier A1 controls the transistors M1 and M2 to be turned on or off in a complementary manner according to the potential difference between the first positive-phase input TDFBp and the first reverse-phase input TDFBm, the potential difference between the second positive-phase input TCFB1p and the second reverse-phase input TCFB1m, and the potential difference between the third positive-phase input TCFB2p and the third reverse-phase input TCFB2m.

Figure 3:
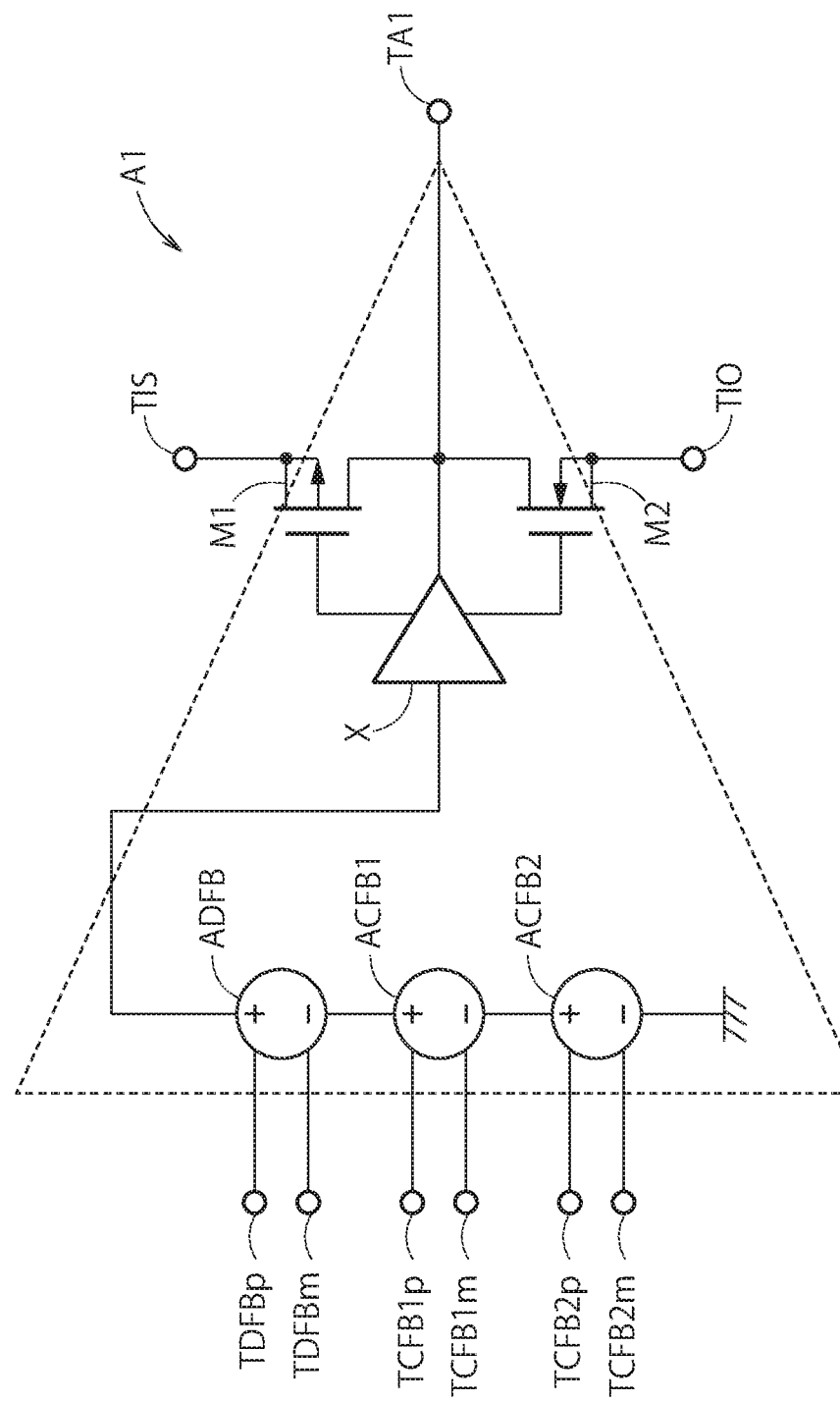
FIG. 3 is a diagram showing another example of the configuration of the output amplifier shown in FIG. 1.

FIG. 3 is a configuration diagram showing another example of the output amplifier A1. The other output amplifiers A2 to A8 have the same configuration. The output amplifier A1 includes differential input voltage controlled voltage source (vcvs) circuits ADFB, ACFB1, and ACFB2, the driver X, and the pMOS transistor M1 and the nMOS transistor M2 of a complementary type.

One end (a source) of a current path of the transistor M1 is connected to the current source terminal TIS. The other end (a drain) of the current path is connected to the output terminal TA1. One end (a drain) of a current path of the transistor M2 is connected to the output terminal TA11. The other end (a source) of the current path is connected to the current sink terminal TIO.

The voltage controlled voltage source circuit ADFB outputs a voltage according to the potential difference between the first positive-phase input TDFBp and the first reverse-phase input TDFBm. The voltage controlled voltage source circuit ACFB1 outputs a voltage according to the potential difference between the second positive-phase input TCFB1p and the second reverse-phase input TCFB1m. The voltage controlled voltage source circuit ACFB2 outputs a voltage according to the potential difference between the third positive-phase input TCFB2p and the third reverse-phase input TCFB2m, Amplification factors of the voltage controlled voltage source circuits ADFB, ACFB1, and ACFB2 are set to any values, Outputs of the voltage controlled voltage source circuits ADFB, ACFB1, and ACFB2 are added up and further amplified by the driver X.

If the potential at the positive-phase input terminal is higher than the potential at the reverse-phase input terminal the voltage controlled voltage source circuit is amplified to the positive phase. If an added-up output of the voltage controlled voltage source circuits ADFB, ACFB1, and ACFB2 has a positive phase, the voltage controlled voltage source circuits ADFB, ACFB1, and ACFB2 operate to amplify the output terminal to the positive-phase side.

That is, the output amplifier A1 controls the transistors M1 and M2 to be turned on or off in a complementary manner according to the potential difference between first positive-phase input TDFBp and the first reverse-phase input TDFBm, the potential difference between the second positive-phase input TCFB1p and the second reverse-phase input TCFB1m, and the potential difference between the third positive-phase input TCFB2p and the third reverse-phase input TCFB2m.

Figure 4:
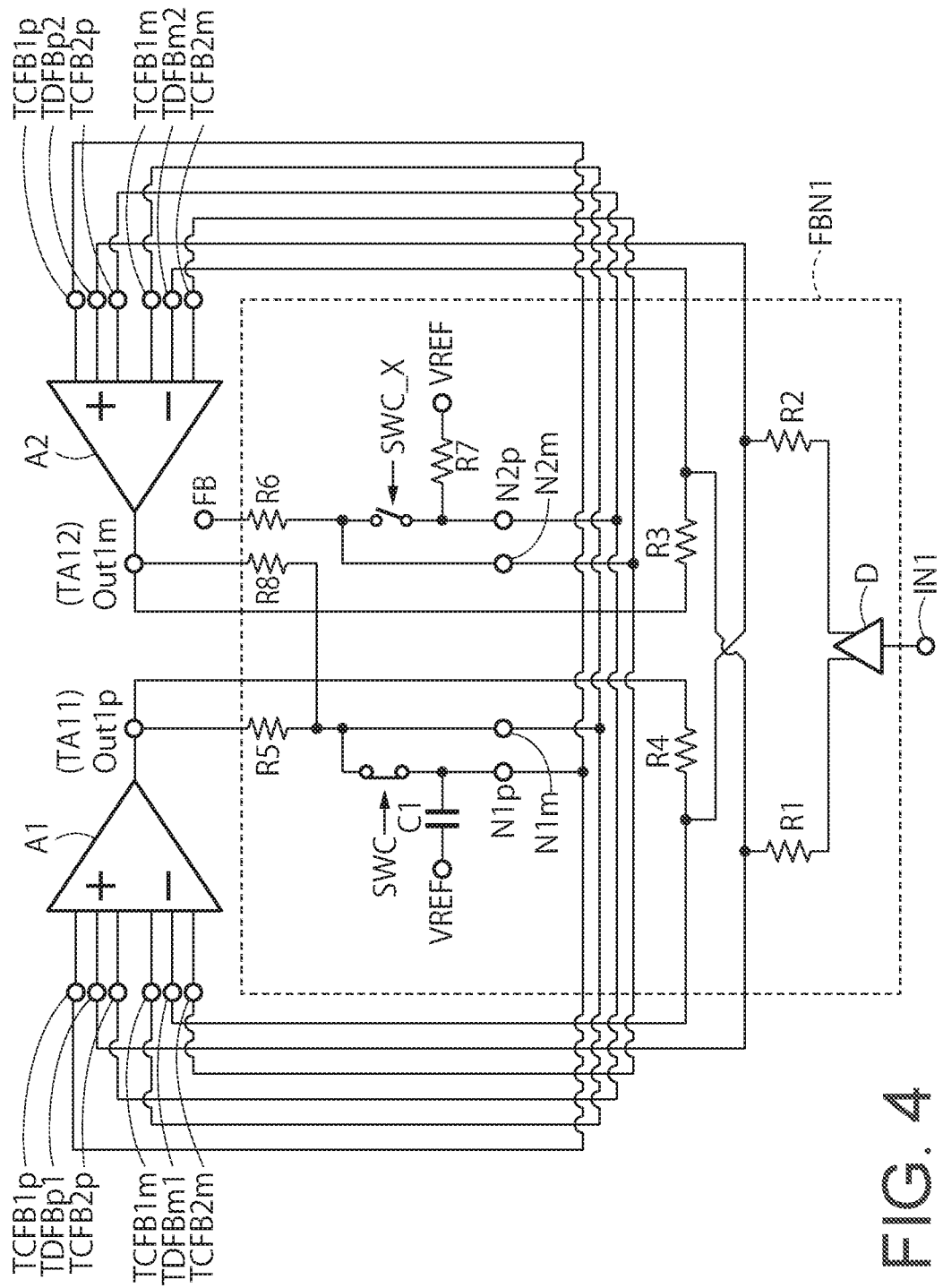
FIG. 4 is a diagram showing an example of the configuration of a first control circuit shown in FIG. 1.

FIG. 4 is a configuration diagram showing an example of the first control circuit FBN1. The second to fourth control circuits FBN2 to FBN4 have the same configuration. The first control circuit FBN1 shown in FIG. 4 includes a differential amplifier D, resistors R1 to RB, a first control switch SWC, a second control switch SWC_X and a capacitor C1.

A first input signal is supplied to an input of the differential amplifier D. The differential amplifier D outputs a differential signal based on the first input signal as a first output and a second output. The first output is connected to the first positive-phase input TDFBp of the output amplifier A1 and the first reverse-phase input TDFBm of the output amplifier A2 via the resistor R1 and connected to the output terminal TA12 via the resistors R1 and R3. The second output is connected to the first reverse-phase input TDFBm of the output amplifier A1 and the first positive-phase input TDFBp of the output amplifier A2 via the resistor R2 and connected to the output terminal TA1 via the resistors R2 and R4.

One end of the first control switch SWC is connected to the second reverse-phase input TCFB1m of the output amplifier A1 and connected to the output terminal TA11 via the resistor R5. The other end of the first control switch SWC is connected to the second positive-phase inputs TCFB1p of the output amplifiers A1 and A2, The reference voltage VREF is supplied to the other end of the first control switch SWC via the capacitor C1. The first control switch SWC is turned on or off in synchronization with the first switch circuit SWL.

One end of the second control switch SWC_X is connected to the feedback terminal TFB and the third reverse-phase inputs TCFB2m of the output amplifiers A1 and A2 via the resistor R6. The other end of the second control switch SWC_X is connected to the third positive-phase inputs TCFB2p of the output amplifiers A1 and A2. The second control switch SWC_X is turned on or off complementarily to the first control switch SWC.

One of control loops, that is, a differential feedback loop specified by the resistors R1 to R4 always functions. The differential feedback loop controls the potential difference between the first positive-phase input TDFBp and the first reverse-phase input TDFBm to always maintain a gain of a voltage between the output terminals TA1 and TA2 substantially constant from the terminal IN1. The differential feedback loop controls the potential difference between the first positive-phase input TDFBp and the first reverse-phase input TDFBm to always maintain a gain of a voltage between the output terminals TA11 and TA12 substantially constant from the terminal IN1.

A feedback control loop defined by the resistors R5 and R8, the capacitor C1, and the reference voltage VREF controls the potential difference between the second positive-phase input TCFB1p and the second reverse-phase input TCFB1m. The resistor R5 may detect a common mode voltage of the output terminals TA11 and TA12 using the same value as the resistor RB or detect the voltage at the output terminal TA11 assuming that the resistor R5<< the resistor R8.

A feedback control loop defined by the resistors R6 and R7, and the reference voltage VREF controls the potential difference between the third positive-phase input TCFB2p and the third reverse-phase input TCFB2m. The first output amplifier A1 outputs, from the output terminal TA1, signals corresponding to the potential difference between the first positive-phase input TDFBp1 and the first reverse-phase input TDFBm1, the potential difference between the second positive-phase input TCFB1p and the second reverse-phase input TCFB1m, and the potential difference between the third positive-phase input TCFB2p and the third reverse-phase input TCFB2m of the first output amplifier A1, The second output amplifier A2 outputs, from the output terminal TA2, signals corresponding to the potential difference between the first positive-phase input TDFBp2 and the first reverse-phase input TDFBm2, the potential difference between the second positive-phase input TCFB1p and the second reverse-phase input TCFB1m, and the potential difference between the third positive-phase input TCFB2p and the third reverse-phase input TCFB2m of the second output amplifier A2.

The potential difference between a node Nip and a node N1m is zero in a period in which the first control switch SWC is on (a period in which the second control switch SWC_X is off). In this period, via the resistors R7 and R8, the capacitor C1 is charged such that the voltage at the node Nip is equal to a partial voltage of the voltage between the output terminals TA11 and TA12, The charging to the capacitor C1 is referred to as sample mode.

Figure 5:
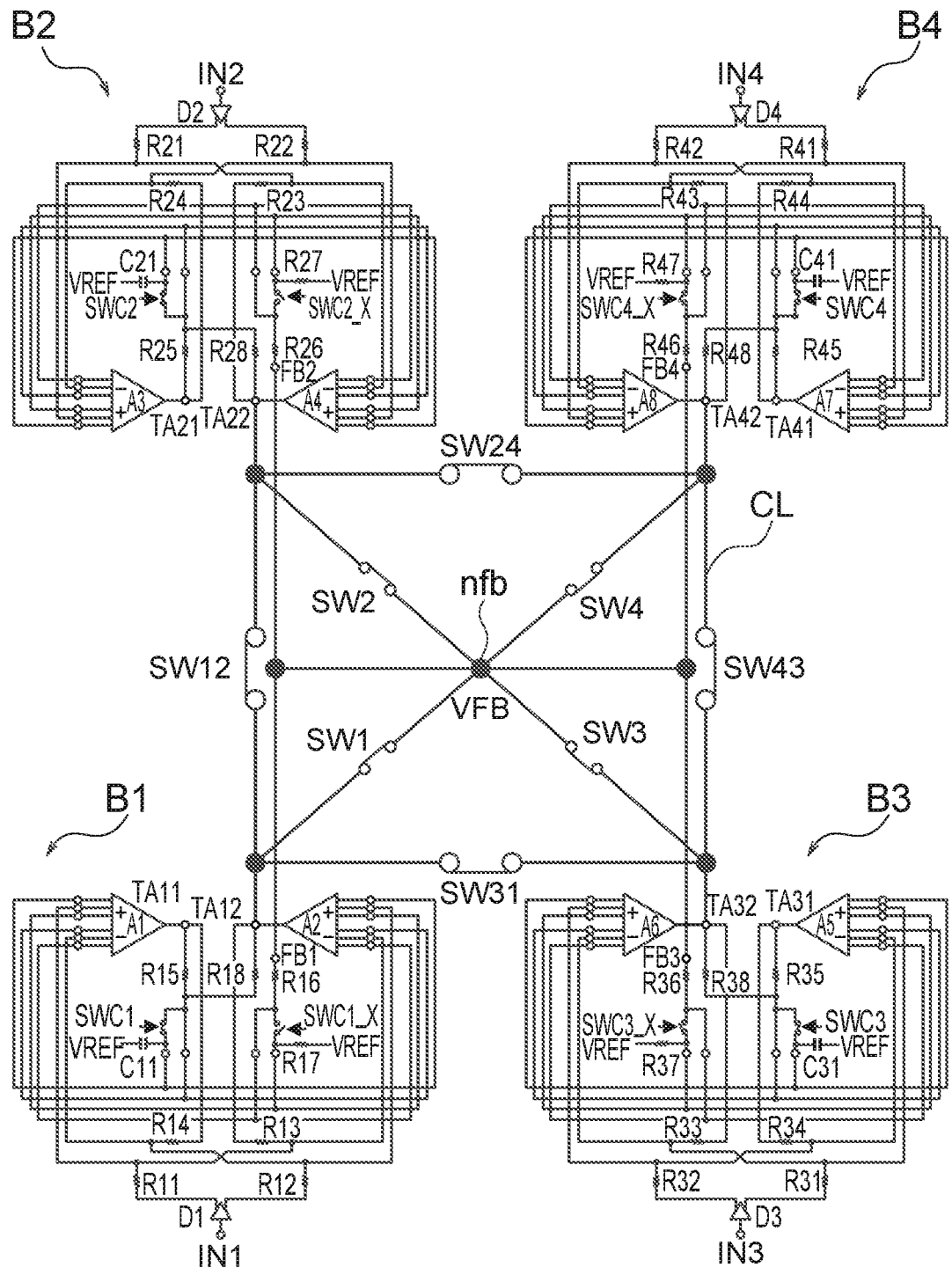
FIG. 5 is a diagram showing, in detail, the configuration of the audio system including the power amplifying device.

In this period, since the potential difference between the node Nip and the node N1m is zero, the output current of the gm circuit GmCFB1 shown in FIG. 2 is zero. The gm circuit GmCFB1 does not contribute to the amplifying operation of the output amplifiers. Further, in this period, since the second control switch SWC_X is off, the gm circuit GmCFB2 is in a controlled state. The reference voltage VREF is supplied to the third positive-phase inputs TCFB2p of the output amplifiers A1 and A2 via the resistor R7. Consequently, a control loop of the third positive-phase input TCFB2p and the third reverse-phase input TCFB2m operate to equalize the voltage of the feedback terminal FB to the reference voltage VREF (the small signal mode). The voltage of the feedback terminal FB is connected to the output terminal TA12 via the first supply switch circuit SW1 as shown in FIG. 5.

That is, when the first switch circuit SW12 is on (the first control switch SWC is on and the second control switch SWC_X is off) and the third switch circuit SW31 is on, the first control circuit FBN1 sets the output of the output amplifier A2 to the reference potential VREF.

The potential difference between a node N2p and a node N2m is zero in a period in which the first control switch SWC is off (a period in which the second control switch SWC_X is on), Therefore, the output current of the gm circuit GmCFB2 is zero. The gm circuit GmCFB2 does not contribute to the amplifying operation of the output amplifiers. Since the first control switch SWC is turned off, electric charges stored in the capacitor C1 are retained. The retaining of the electric charges stored in the capacitor C1 is referred to as hold mode.

In the hold mode, the potential at the output terminal TA11 is referred to and supplied to the node N1m via the resistors R5 and R8 and the voltage retained in the capacitor C1 is supplied to the node Nip, Therefore, a control loop for the second positive-phase input TCFB1p and the second reverse-phase input TCFB1m operates to equalize the common mode voltages at the output terminals TA11 and TA12 to a value immediately before turn-off of the first control switch SWC (the large signal mode).

The differential feedback loop is only a loop for fixing a differential gain and cannot determine direct-current voltages at the output terminals TA11 and TA12. Therefore, the determination of the direct-current voltages at the output terminals TA11 and TA12 is performed in the control loop for the third positive-phase input TCFB2p and the third reverse-phase input TCFB2m or the control loop for the second positive-phase input TCFB1p and the second reverse-phase input TCFB1m. The second to fourth control circuits FBN2 to FBN4 execute the same control operation, FIG. 5 is a diagram showing a detailed configuration example of the audio system including the power amplifying device 100, The configuration of each of the first to fourth BTL amplifiers B1 to B4 is equivalent to the configuration of the first control circuit FBN1 shown in FIG. 4, In the following explanation the equivalent components in the first to fourth BTL amplifiers B1 to B4 are sometimes explained using the reference numerals and signs in FIGS. 2 to 4. That is, in FIG. 5, output signals at the terminals TA11, TA12, TA21, TA22, TA31, TA32, TA41, and TA42 are indicated by Out1p, Out1m, Out2m, Out2p, Out3m, Out3p, Out4p, and Out4m, The first to fourth input signals are supplied to the respective first to fourth terminals IN1 to IN4.

The feedback terminals FB1 to FB4 are connected via a node nfb. Consequently, a common mode voltage VFB of the output terminals TA12, TA22, TA32, and TA42 is applied to the feedback terminals FB1 to FB4, Note that, in this embodiment, the resistor R6 and the resistor R7 (FIG. 4) are set to an equal resistance value to set the common mode voltage VFB to a voltage equal to the reference voltage VR F. That is, the voltage of the node nfb is controlled to be always the voltage equal to the reference voltage VREF.

A first supply switch circuit SW1, a second supply switch circuit SW2, a third supply switch circuit SW3, and a fourth supply switch circuit SW4 are connected between the respective output terminals TA12, TA22, TA32, and TA42 and the node nfb.

The first supply switch circuit SW1 is turned on while the first BTL amplifier 61 is in the small signal mode and is turned off while the first BTL amplifier B1 is in the large signal mode. When being turned on, the first supply switch circuit SW1 supplies the voltage VFB to the output terminal TA12.

The second supply switch circuit SW2 is turned on while the second BTL amplifier B2 is in the small signal mode and is turned off while the second BTL amplifier B2 is in the large signal mode. When being turned on, the second supply switch circuit SW2 supplies the voltage VFB to the output terminal TA22.

The third supply switch circuit SW3 is turned on while the third BTL amplifier B3 is in the small signal mode and is turned off while the third BTL amplifier B3 is in the large signal mode. When being turned on, the third supply switch circuit SW3 supplies the voltage VFB to the output terminal TA32.

The fourth supply switch circuit SW4 is turned on while the fourth BTL amplifier B4 is in the small signal mode and is turned off while the fourth BTL amplifier B4 is in the large signal mode. When being turned on, the fourth supply switch circuit SW4 supplies the voltage VFB to the output terminal TA42.

Only while the first switch circuit SW12 is on, outputs of the output amplifiers A2 and A4 are set to reference potential VREF if gates of the transistors M1 of the output amplifiers A2 and A4 are short-circuited and gates of the transistors M2 of the output amplifiers A2 and A4 are short-circuited. Therefore, it is possible to control output currents of the output amplifiers A2 and A4 to be equal.

Similarly, only while the second switch circuit SW24 is on, outputs of the output amplifiers A4 and A8 are set to the reference potential VREF if gates of the transistors M1 of the output amplifiers A4 and A8 are short-circuited and gates of the transistors M2 of the output amplifiers A4 and A8 are short-circuited. Therefore, it is possible to control output currents of the output amplifiers A4 and A8 to be equal.

Similarly, only while the third switch circuit SW31 is on, outputs of the output amplifiers A2 and A6 are set to the reference potential VREF if gates of the transistors M1 of the output amplifiers A2 and A6 are short-circuited and gates of the transistors M2 of the output amplifiers A2 and A6 are short-circuited. Therefore, it is possible to control output currents of the output amplifiers A2 and A6 to be equal.

Similarly, only while the fourth switch circuit SW43 is on, outputs of the output amplifiers A6 and A8 are set to the reference potential VREF if gates of the transistors M1 of the output amplifiers A6 and A8 are short-circuited and gates of the transistors M2 of the output amplifiers A6 and A8 are short-circuited. Therefore, it is possible to control output currents of the output amplifiers A6 and A8 to be equal.

Figure 6:
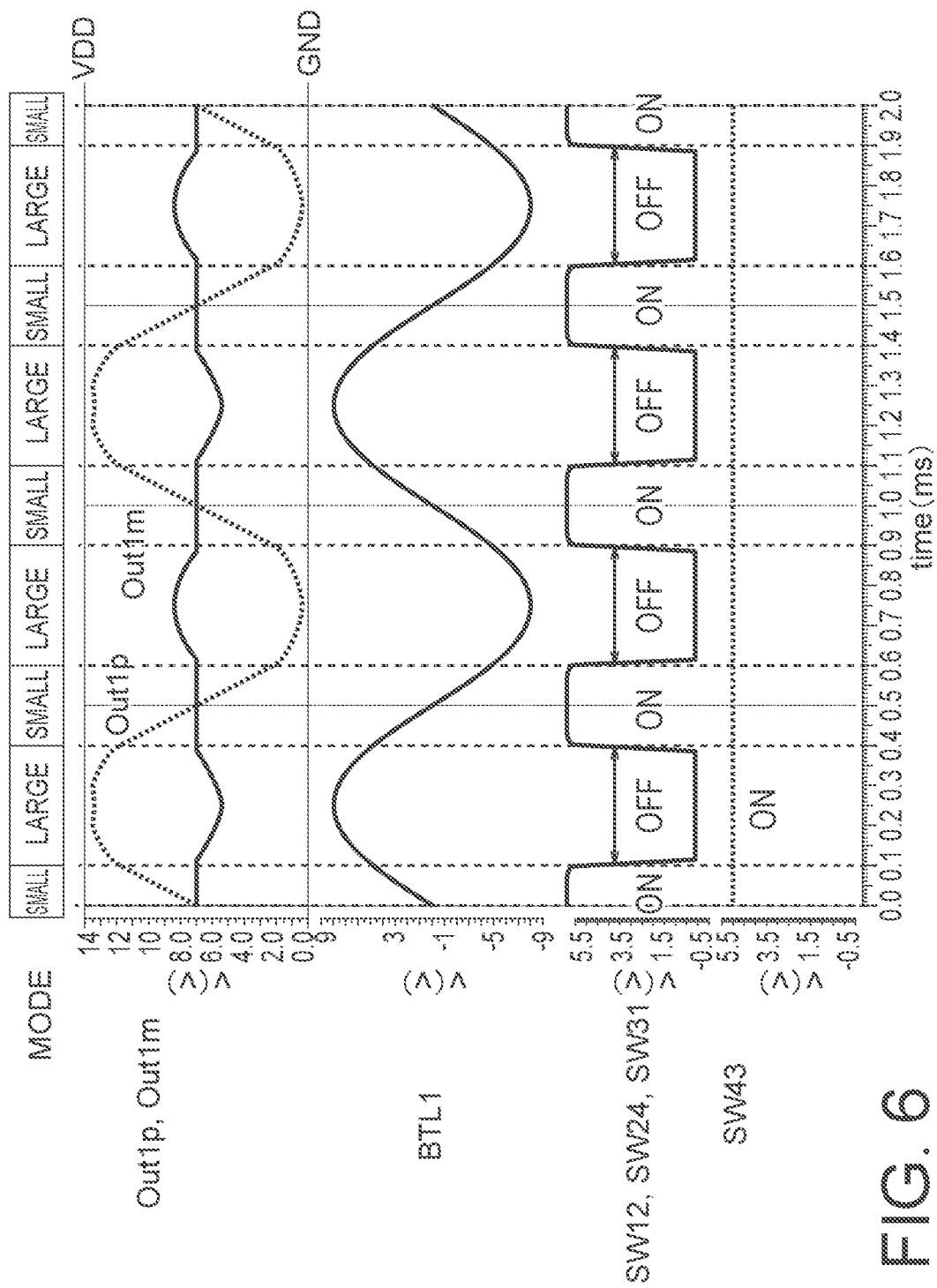
FIG. 6 is a diagram showing an example of a relation between output waveforms and modes of a BTL amplifier.

FIG. 6 is a diagram showing an example of a relation between output waveforms and modes. The lateral axis indicates time.

An upper stage in FIG. 6 shows waveforms of an output signal Out1p at the output terminal TA11 and an output signal Out1m at the output terminal TA12. The next stage indicates a differential waveform BTL1 between the output signals Out1p and Out1m. The next stage indicates an example of an ON state and an OFF state of the first switch circuit SW12, the second switch circuit SW24, and the third switch circuit SW31, Further, the next stage indicates an example of an ON state and an OFF state of the fourth switch circuit SW43, The modes transition to the small signal mode and the large signal mode according to the amplitude of an input signal corresponding to the differential waveform BTL1.

Figure 7:
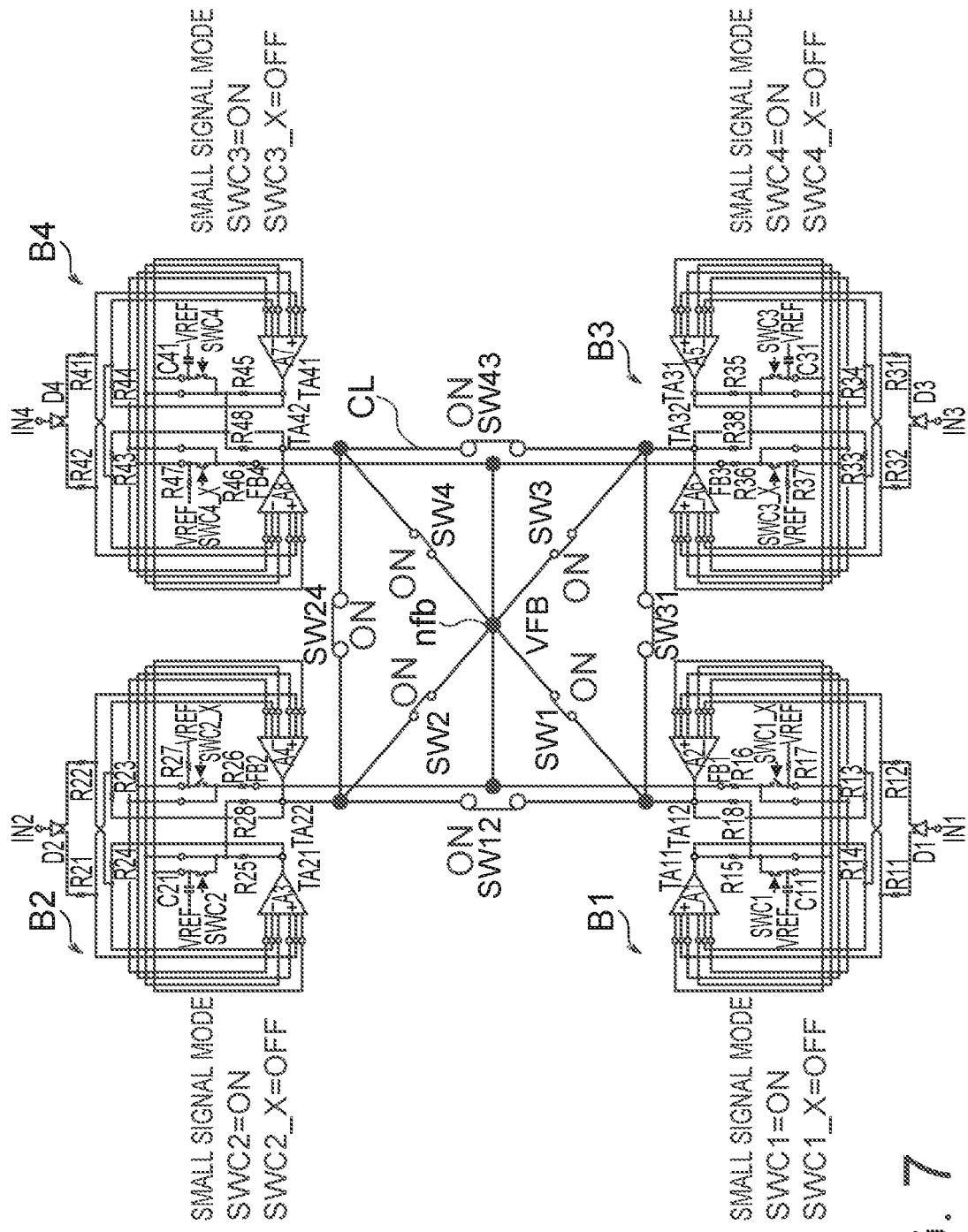
FIG. 7 is a diagram showing a driving state example in a small signal mode.

FIG. 7 is a diagram showing a driving state example at the time when the first to fourth BTL amplifiers B1 to B4 are in the small signal mode. During the small signal mode, all of the first to fourth switch circuits SW12, SW24, SW31, and SW43 are in the ON state. The first to fourth supply switch circuits SW1, SW2, SW3, and SW4 are in the ON state. The first control switches SWC1 to SWC4 are on. The second control switches SWC1_X to SWC4_X are off. The feedback terminals FB1 to FB4 are set to the reference potential VREF.

Figure 8:
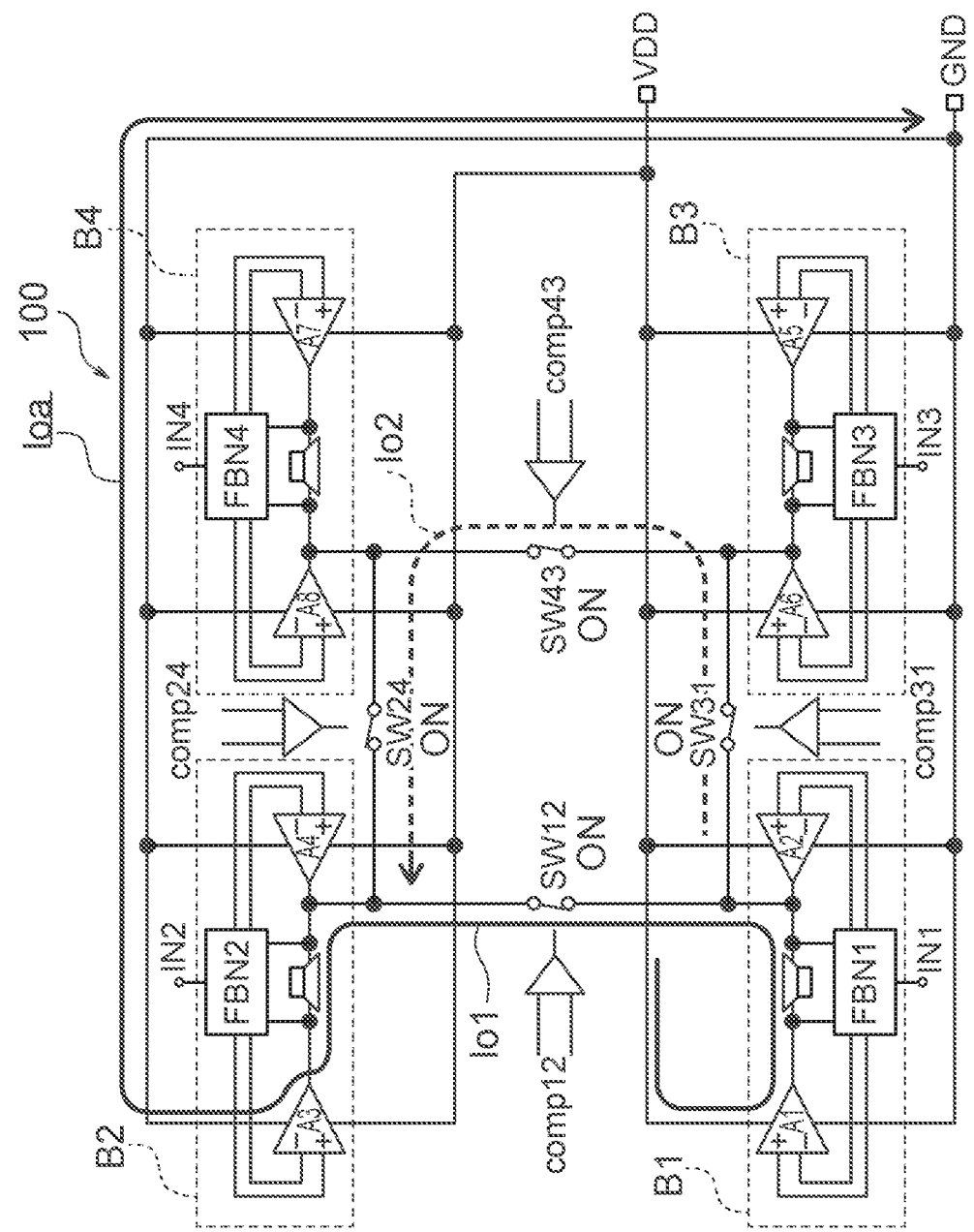
FIG. 8 is a diagram showing a flow of an electric current.

A flow of an electric current at the time when the first BTL amplifier B1 and the second BTL amplifier B2 are reproducing sound and the third BTL amplifier B3 and the fourth BTL amplifier B4 are not reproducing sound is explained with reference to FIGS. 8 and 9. The first to fourth switch circuits SW12, SW24, SW31, and SW43 are on, FIG. 8 is a diagram showing a flow of an electric current at the time when the first and second input signals have positive polarity. When bridge output signals in the first BTL amplifier B1 and the second BTL amplifier B2 have the same phase and the same amplitude, paths of electric currents flowing to the first BTL amplifier B1 and the second BTL amplifier B2 are Io1 and Io2, An electric current Ioa consumed by a power supply is Io1+Io2, That is, by sharing the bridge output current Ioa of the first BTL amplifier B1 and the second BTL amplifier B2, it is possible to reduce a consumed current (2×Ioa) of a normal class-AB amplifier to a half and improve power efficiency.

In this case, the switch circuits SW12, SW24, SW31, and SW43 are turned on and are connected in series in a loop shape. The switch circuit SW12 and each of the switch circuits SW24, SW31, and SW43 are connected in parallel at both ends. When resistance values of the switch circuits W12, SW24, SW31, and SW43 are respectively represented as Rsw, a resistance value at both ends of the switch circuit SW12 is ¾Rsw. Consequently, a loss that occurs in the switch circuits SW12, SW24, SW31, and SW43 is ¾Rsw× Ioa. The loss can be reduced to smaller than a loss Rsw×Io that occurs in a technique for performing bridging only with the switch circuit SW12 as in a general power supply amplifier circuit. Accordingly, a power capacity of the switch circuits SW12, SW24, SW31, and SW43 can be reduced to ¾. For example, when the switch circuits SW12, SW24, SW31, and SW43 are configured by an n-type transistor, the switch circuits SW12, SW24, SW31, and SW43 can be further reduced in size.

Figure 9:
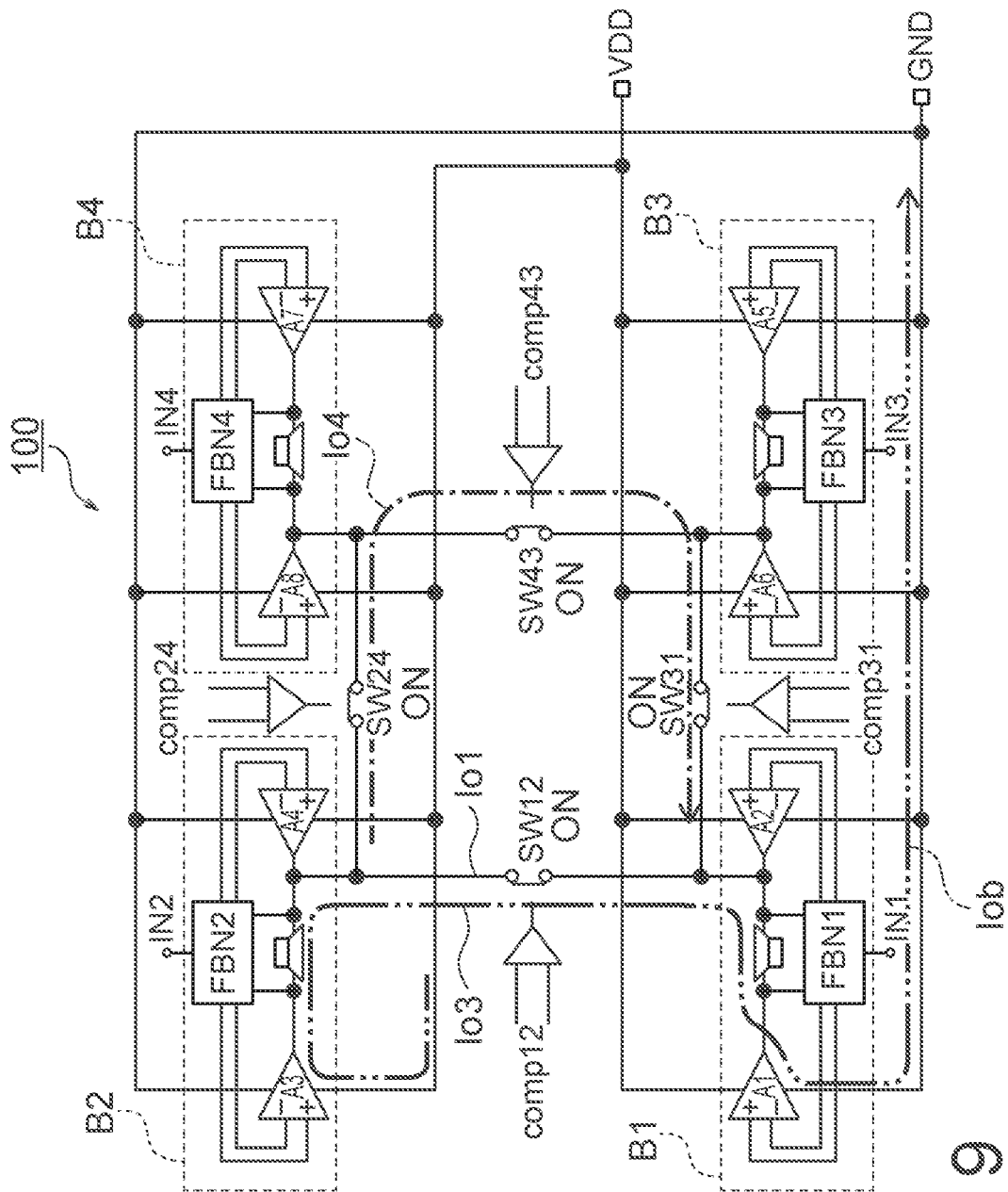
FIG. 9 is a diagram showing a flow of an electric current in the case of a negative polarity signal.

FIG. 9 is a diagram showing a flow of an electric current at the time when the first and second input signals have a negative polarity. An electric current Io4 having the opposite direction to the electric current Io2 and having the same absolute value as the electric current Io2 flows to the switch circuits SW24, SW31, and SW43. An electric current Io3 having the opposite direction to the electric current Io1 and having the same absolute value as the electric current Io1 flows to the first switch circuit SW12. That is, an electric current Iob consumed in the power supply is Io3+Io4. Even when the first and second input signals have a negative polarity, by sharing the bridge output current Iob of the first BTL amplifier B1 and the second BTL amplifier B2, it is possible to reduce the consumed current (2×Ioa) of the normal class-AB amplifier to a half and improve power efficiency.

Similarly, a resistance value at both ends of the switch circuit SW12 is ¾Rsw according to a connection state of the switch circuits SW12, SW24, SW31, and SW43, Consequently, a loss that occurs in the switch circuits SW12, SW24, SW31, and SW43 is ¾Rsw×Iob. The loss can be reduced to smaller than a loss Rsw×Iob that occurs in the technique for performing bridging only with the switch circuit SW12 as in the general power supply amplifier circuit. Accordingly, a power capacity of the switch circuits SW12, SW24, SW31, and SW43 can be reduced to ¾.

Figure 10:
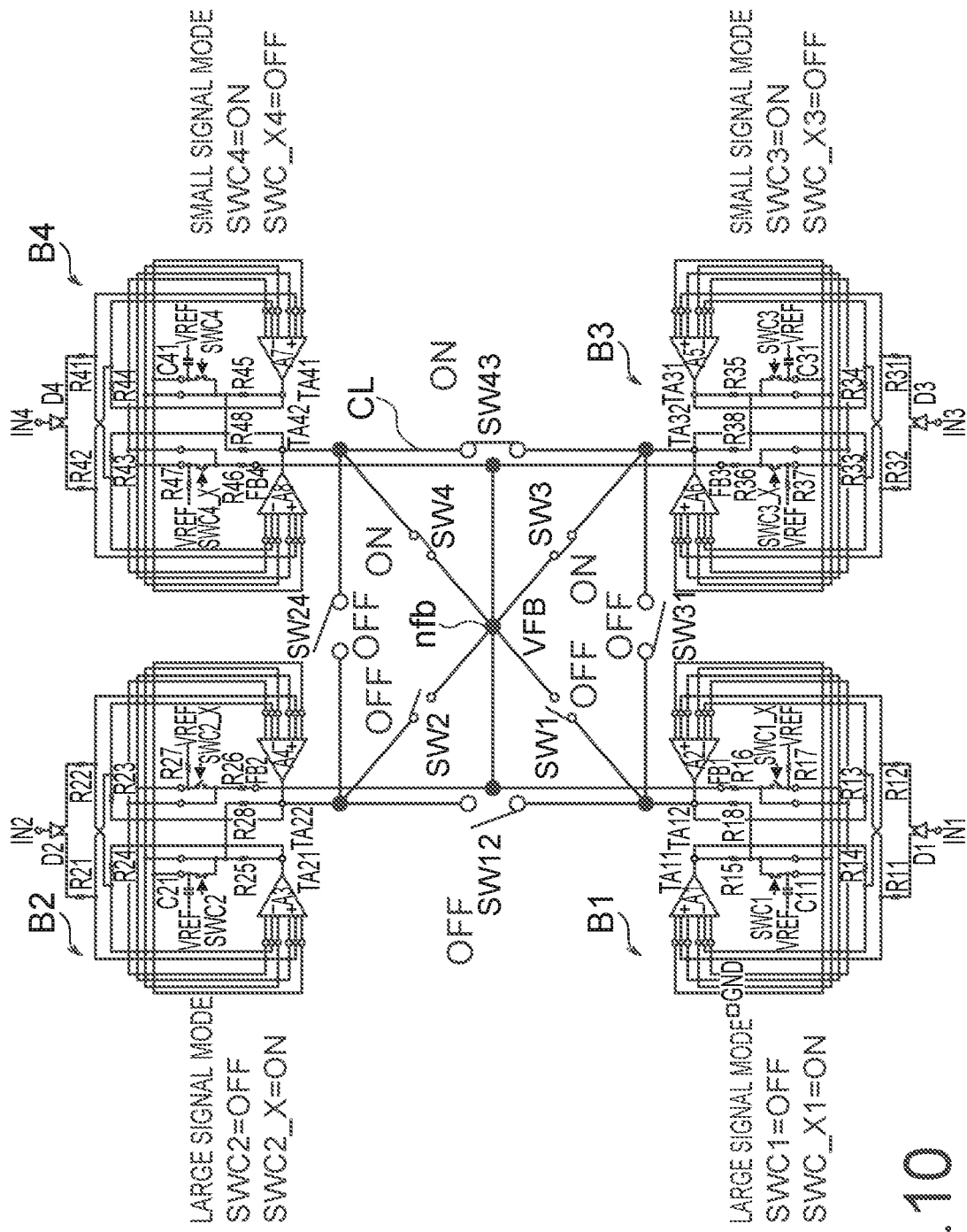
FIG. 10 is a diagram showing a driving state example at the time when first and second BTL amplifiers are in a large signal mode and third and fourth BTL amplifiers are in a small signal mode.

FIG. 10 is a diagram showing a driving state example at the time when the first and second BTL amplifiers B1 and B2 are in the large signal mode and the third and fourth BTL amplifiers 63 and 64 are in the small signal mode. The first, second, and third switch circuits SW12, SW24, and SW31 are off and the fourth switch circuit SW43 is on. The first control switches SWC1 and SWC2 are off and the first control switches SWC3 and SWC4 are on. The second control switches SWC1_X and SWC2_X are on and the second control switches SWC3_X and SWC4_X are off. The first and second supply switch circuits SW1 and SW2 are off and the second and fourth supply switch circuits SW3 and SW4 are on.

Figure 11:
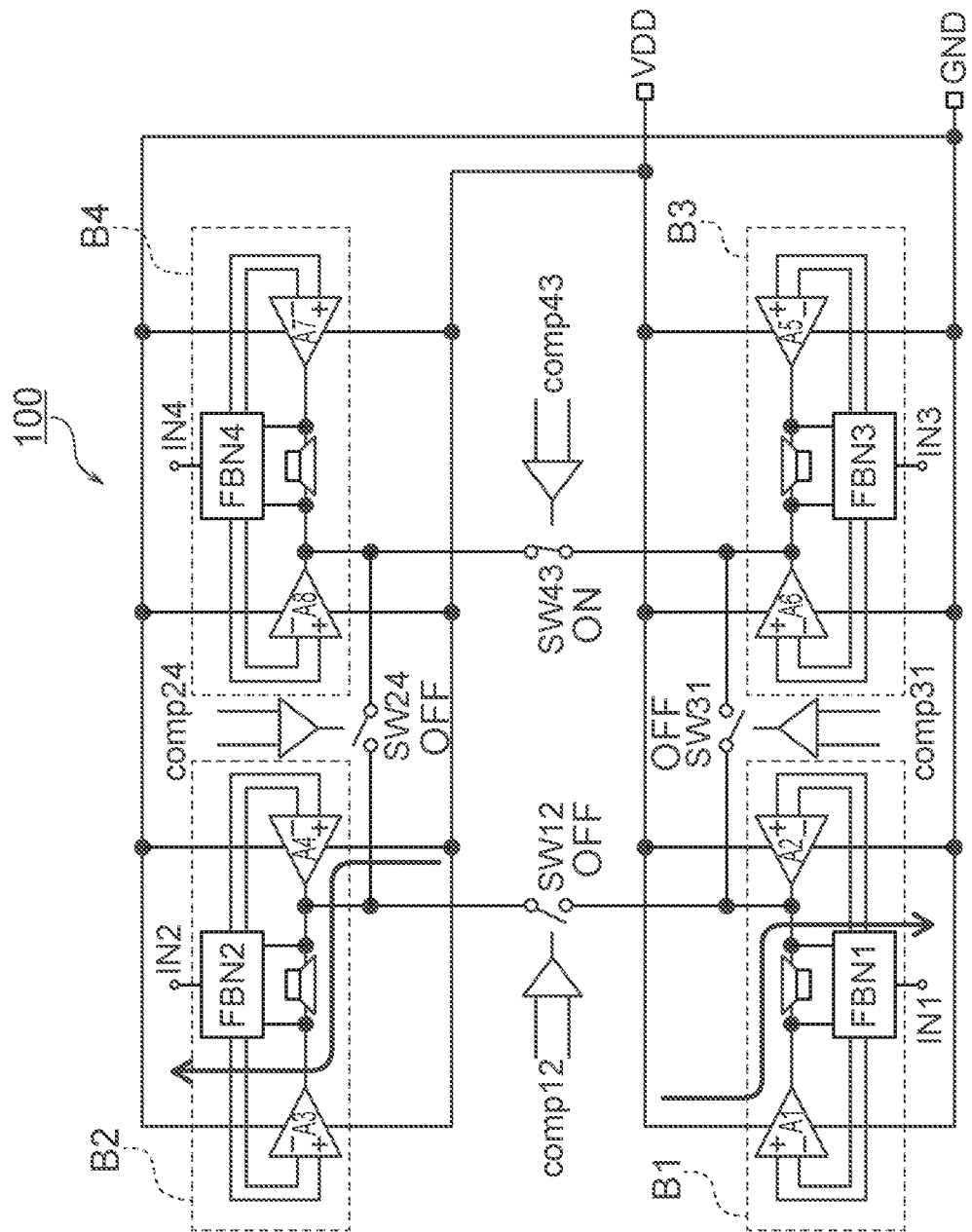
FIG. 11 is a diagram showing an example of an electric current flow in the signal modes shown in FIG. 10.
Figure 12:
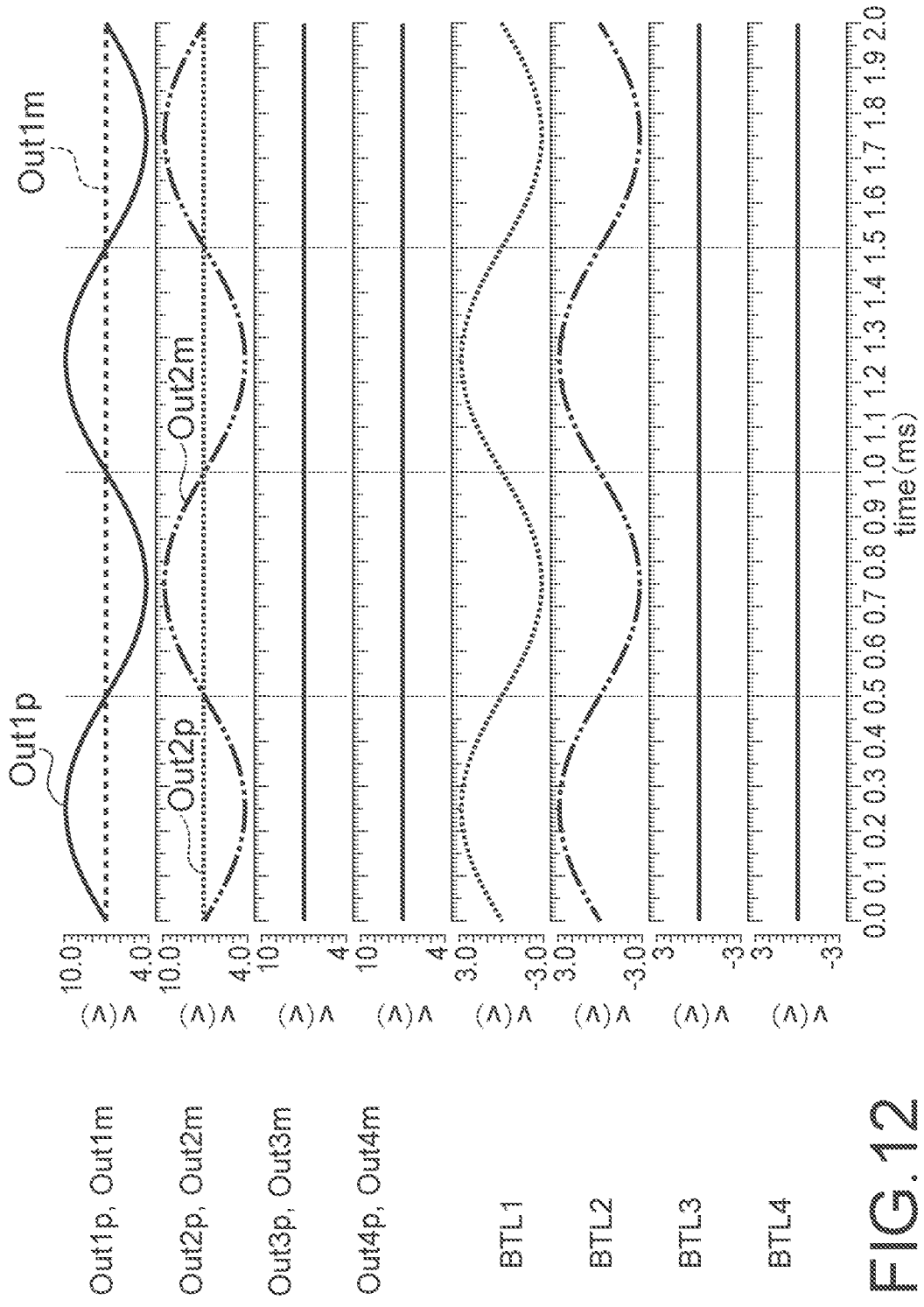
FIG. 12 is a diagram showing an output signal example during the small signal mode.

FIG. 11 is a diagram showing an example of an electric current flow in the signal modes shown in FIG. 10, The first and second BTL amplifiers B1 and B2 in the large signal mode consume an electric current in each of channels, Therefore, power efficiency η is equivalent to power efficiency in the class-AB. However, a general sound signal involves zero-cross like a sine wave even if the general sound signal is a large signal. Accordingly, the first and second BTL amplifiers 61 and B2 transition to the large signal mode through the small signal mode in a high-efficiency state. Therefore, the power efficiency for one cycle is improved compared with the power efficiency in the class-AB, FIG. 12 is a diagram showing an output signal example at the time when the first to fourth BTL amplifiers B1 to B4 are in the small signal mode. Operations at the time when the first BTL amplifier B1 and the second BTL amplifier B2 are reproducing sound and the third BTL amplifier B3 and the fourth BTL amplifier 64 are not reproducing sound are explained.

When an input signal level of the first BTL amplifier 61 and the second BTL amplifier 62 is smaller than a first threshold Th1, that is, in the case of the small signal mode, the switch circuits SW12, SW24, SW31, and SW43 are turned on. The first BTL amplifier and the second BTL amplifier operate in a SEPP mode. In this case, the supply switch circuits SW1, SW2, SW3, and SW4 may also be turned on.

Therefore, the first control switches SWC1 to SWC4 of the control circuits are on and the second control switches SWC1_X to SWC4_X are off.

An output signal Outlet of the output amplifier A2 is focused. Since the first control switch SWC1 is on, the same potential is set in the first positive-phase terminal and the first reverse-phase terminal of the output amplifier A1, Since the potential difference is 0, an output current of the gm circuit gain GmDFB is 0 and does not contribute to the operation of the output amplifier A1.

Since the second control switch SWC_X1 is off, the gm circuit GmCFB2 is in a controlled state. That is, the output signal Out1$m$ is supplied to the third revere-phase input TCFB2$m$ via the resistor R16 and the reference voltage VREF is supplied to the third positive-phase input TCFB2$p$ via the resistor R17. Consequently, a control loop of the third positive-phase input TCFB2$p$ and the third reverse-phase input TCFB2$m$ operates to equalize the output signal Out1$m$ with the reference voltage VREF. That is, in the small signal mode, the first control circuit FBN1 sets the output signal Out1$m$ to the reference potential VREF.

The output signal Out1$p$ of the output amplifier A1 is focused. Differential amplitude for setting a differential gain of the first BTL amplifier B1 to a fixed specified value appears in the output signal Out1$p$.

The output signal Out2$m$ of the output amplifier A3 is focused. Differential amplitude for setting a differential gain of the second BTL amplifier 62 to a fixed specified value appears in the output signal Out2$m$.

The output signal Out2$p$ of the output amplifier A4 is focused. Since the first switch circuit SW12 is on, the output signal Out2$p$ is equal to the output signal Out1$m$, That is, the first switch circuit SW12 operates to equalize the output signal Out2$p$ with the reference voltage VREF.

The output amplifiers A5 to A8 are focused. Since the third BTL amplifier B3 and the fourth BTL amplifier B4 are not reproducing sound, the output signals Out3$m$, Out3$p$, Out4$p$, and Out4$m$ are VDD/2, which is a voltage at a no signal time.

The output signal BRA of the first BTL amplifier 61 is the difference between the output signal Out1$p$ and the output signal Out1$m$. The output signal BTL2 of the second BTL amplifier 62 is the difference between the output signal Out2$p$ and the output signal Out2$m$. The output signals BTL3 and BTL4 of the third and fourth BTL amplifiers B3 and B4 are 0 at the non-reproduction time.

Figure 14:
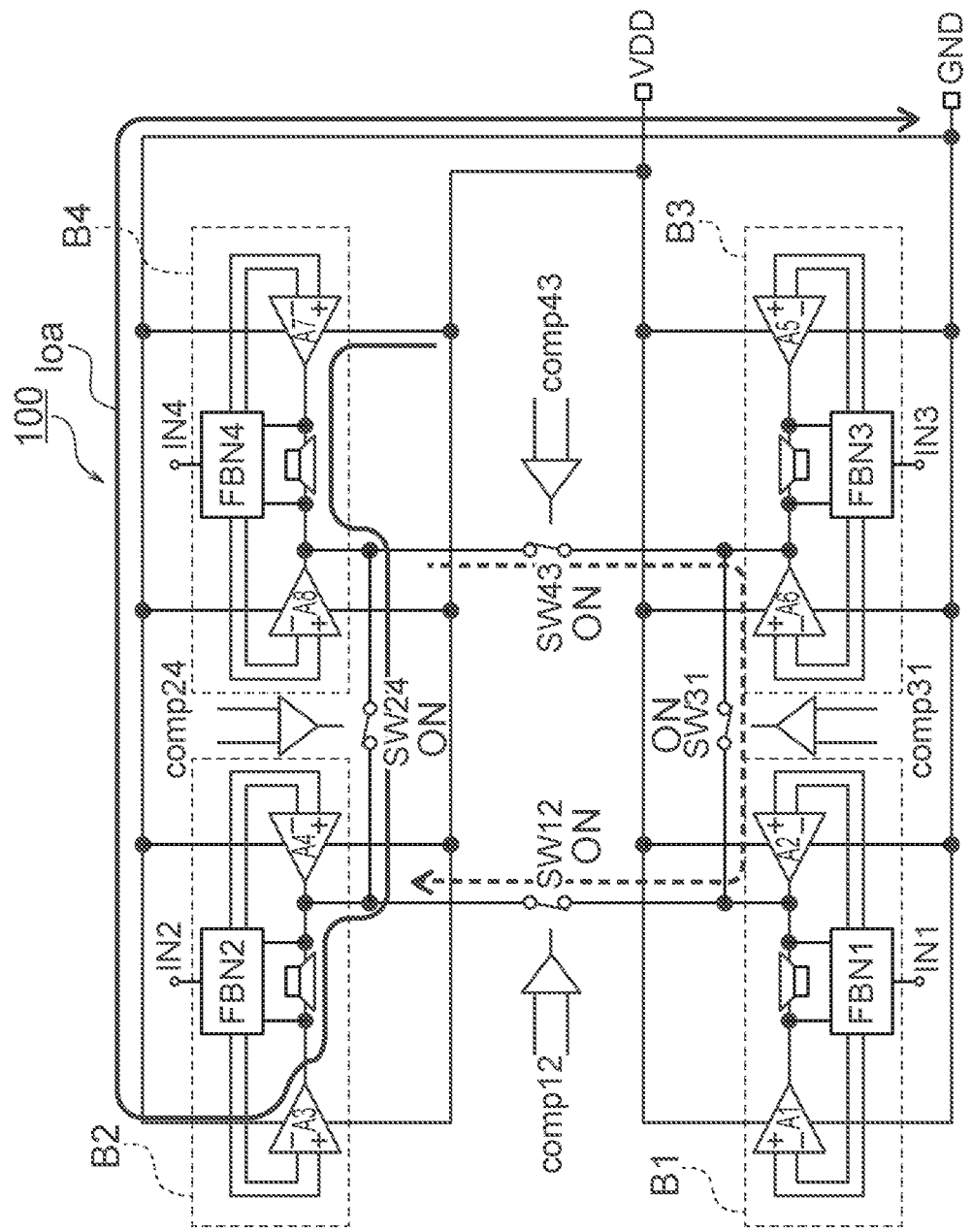
FIG. 14 is a diagram showing an example of an electric current flow at the time when the second BTL amplifier and the fourth BTL amplifier are reproducing sound.
Figure 16:
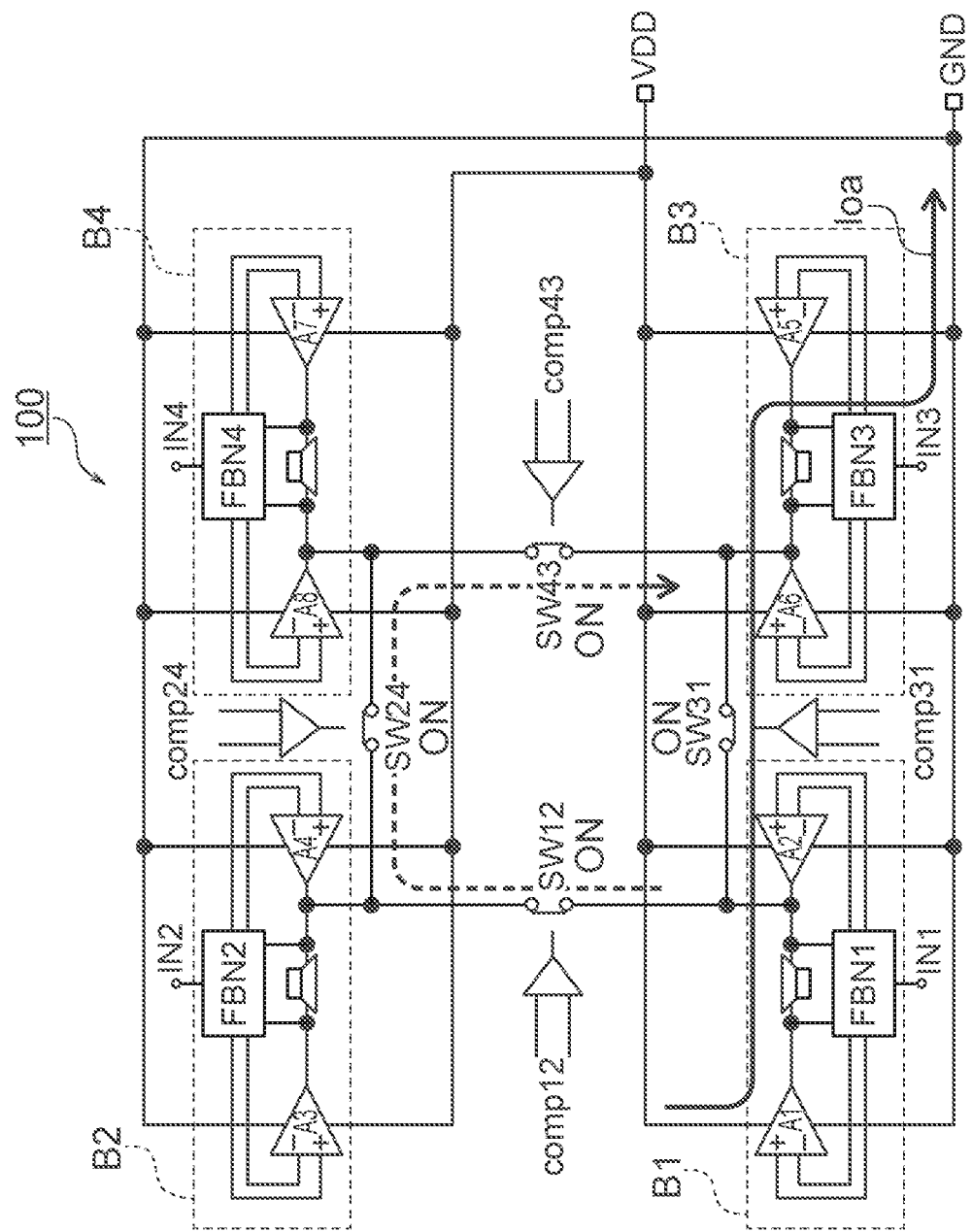
FIG. 16 is a diagram showing an example of an electric current flow at the time when the first BTL amplifier and the third BTL amplifier are reproducing sound.
Figure 18:
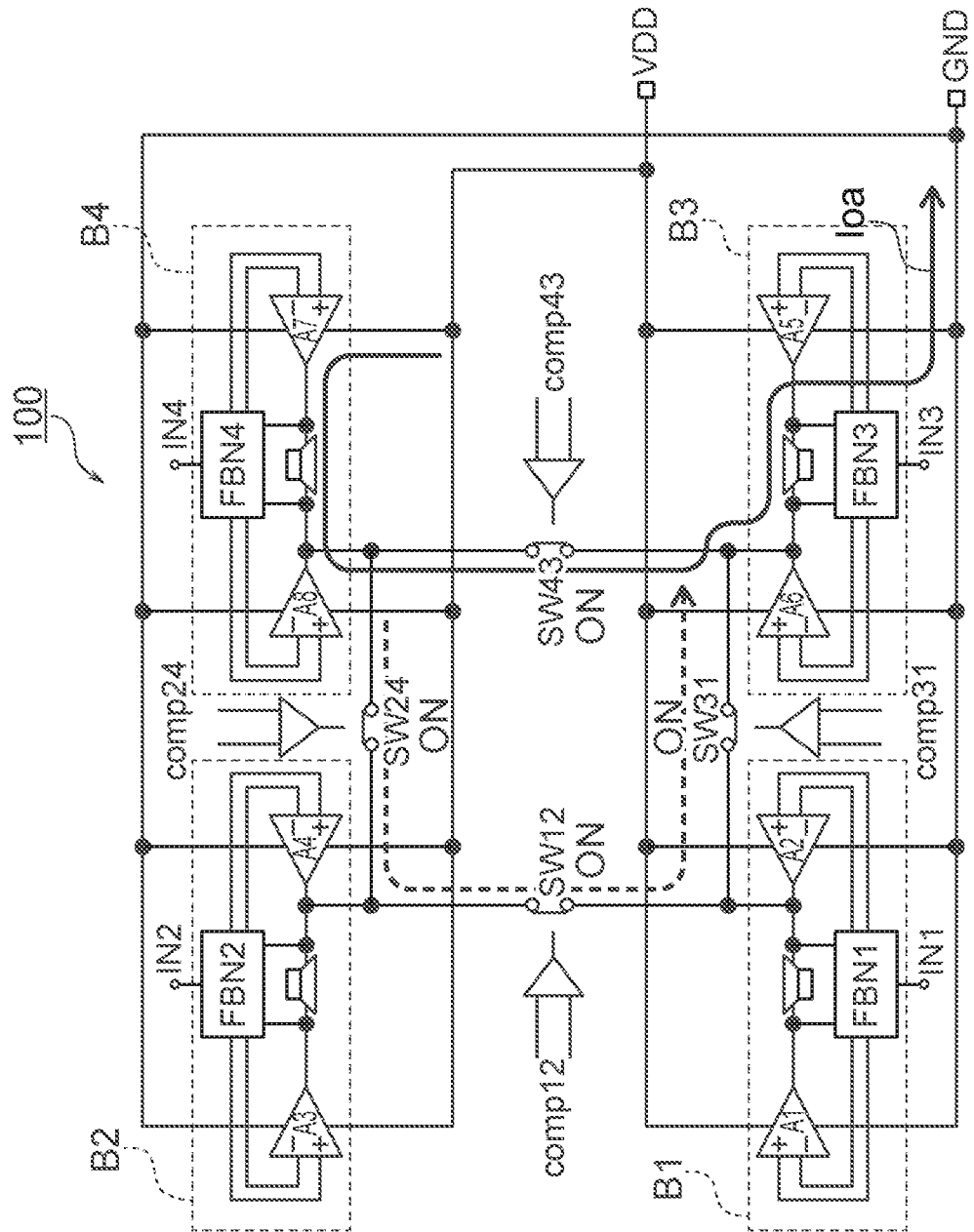
FIG. 18 is a diagram showing an example of an electric current flow at the time when the third BTL amplifier and the fourth BTL amplifier are reproducing sound.

FIG. 13 is a diagram showing a combination example of the first to fourth input signals (ch1 to ch4), "A" indicates an input signal having small amplitude and positive polarity. "−A" Indicates an input signal having small amplitude and negative polarity. "0" indicates a no signal. The small amplitude means amplitude corresponding to the small signal mode. At the time of the small-amplitude input signals, it is possible to reduce the consumed current (2×Io) of the class-AB amplifier to a half and improve power efficiency to a double. Figure numbers of state examples corresponding to the input signals are shown at the right end. FIGS. 14, 16, and 18 referred to below are state diagrams in which the input signals of the first to fourth BTL amplifiers 61 to 64 are in the small signal mode, two input signals have positive polarity, and the remaining two input signals are no signals.

A flow of an electric current at the time when the second BTL amplifier 62 and the fourth BTL amplifier B4 are reproducing sound and the first BTL amplifier 61 and the third BTL amplifier 63 are not reproducing sound is explained with reference to FIGS. 14 and 15.

FIG. 14 is a diagram showing an example of an electric current flow at the time when the first to fourth BTL amplifiers B1 to B4 are in the small signal mode. A path of an electric current flowing to the second BTL amplifier B2 and the fourth BTL amplifier B4 is Ioa. Consequently, it is possible to reduce an electric current consumed by the power supply to a half of the consumed current (2×Ioa) of the normal class-AB amplifier and improve power efficiency.

Figure 15:
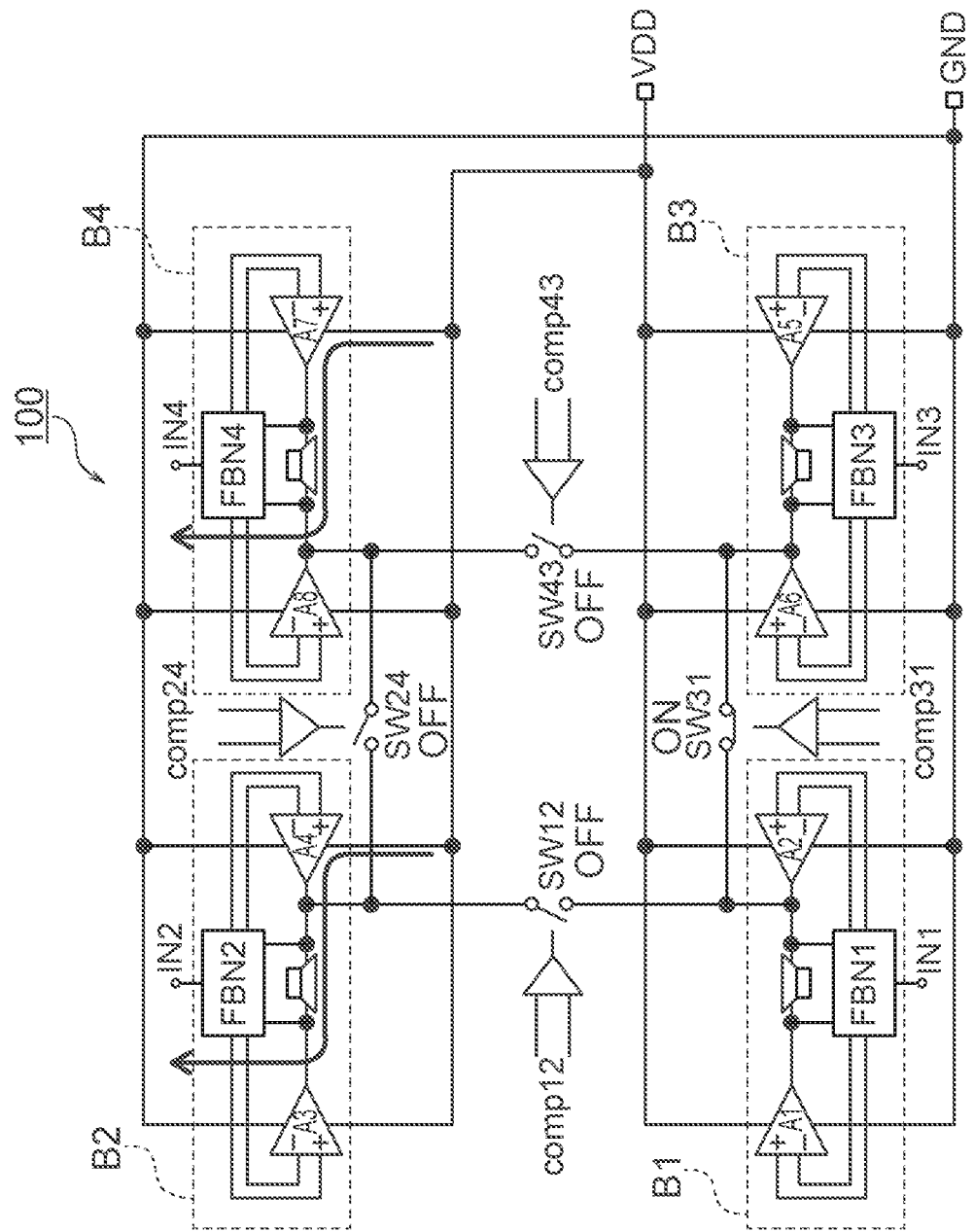
FIG. 15 is a diagram showing an example of an electric current flow at the time when the second BTL amplifier and the fourth BTL amplifier shown in FIG. 14 are in the large signal mode.

FIG. 15 is a diagram showing an example of an electric current flow at the time when the second BTL amplifier B2 and the fourth BTL amplifier B4 are in the large signal mode. The second and fourth BTL amplifiers B2 and B4 consume an electric current in each of channels. Therefore, the power efficiency $T_1$ is equivalent to the power efficiency in the class-AB, However, a general sound signal involves zero-cross like a sine wave even if the general sound signal is a large signal. Therefore, the second and fourth BTL amplifiers B2 and 64 transition to the large signal mode through the small signal mode in a high-efficiency state. Therefore, the power efficiency η for one cycle is improved compared with the power efficiency in the class-AB.

A flow of an electric current at the time when the first BTL amplifier 61 and the third BTL amplifier B3 are reproducing sound and the second BTL amplifier B2 and the fourth BTL amplifier B4 are not reproducing sound is explained with reference to FIGS. 15 and 16.

FIG. 16 is a diagram showing an example of an electric current flow at the time when the first to fourth BTL amplifiers B1 to B4 are in the small signal mode. A path of an electric current flowing to the first BTL amplifier 61 and the third BTL amplifier B3 is Ioa. Consequently, it is possible to reduce an electric current consumed by the power supply to a half of the consumed current (2×Ioa) of the normal class-AB amplifier and improve power efficiency.

Figure 17:
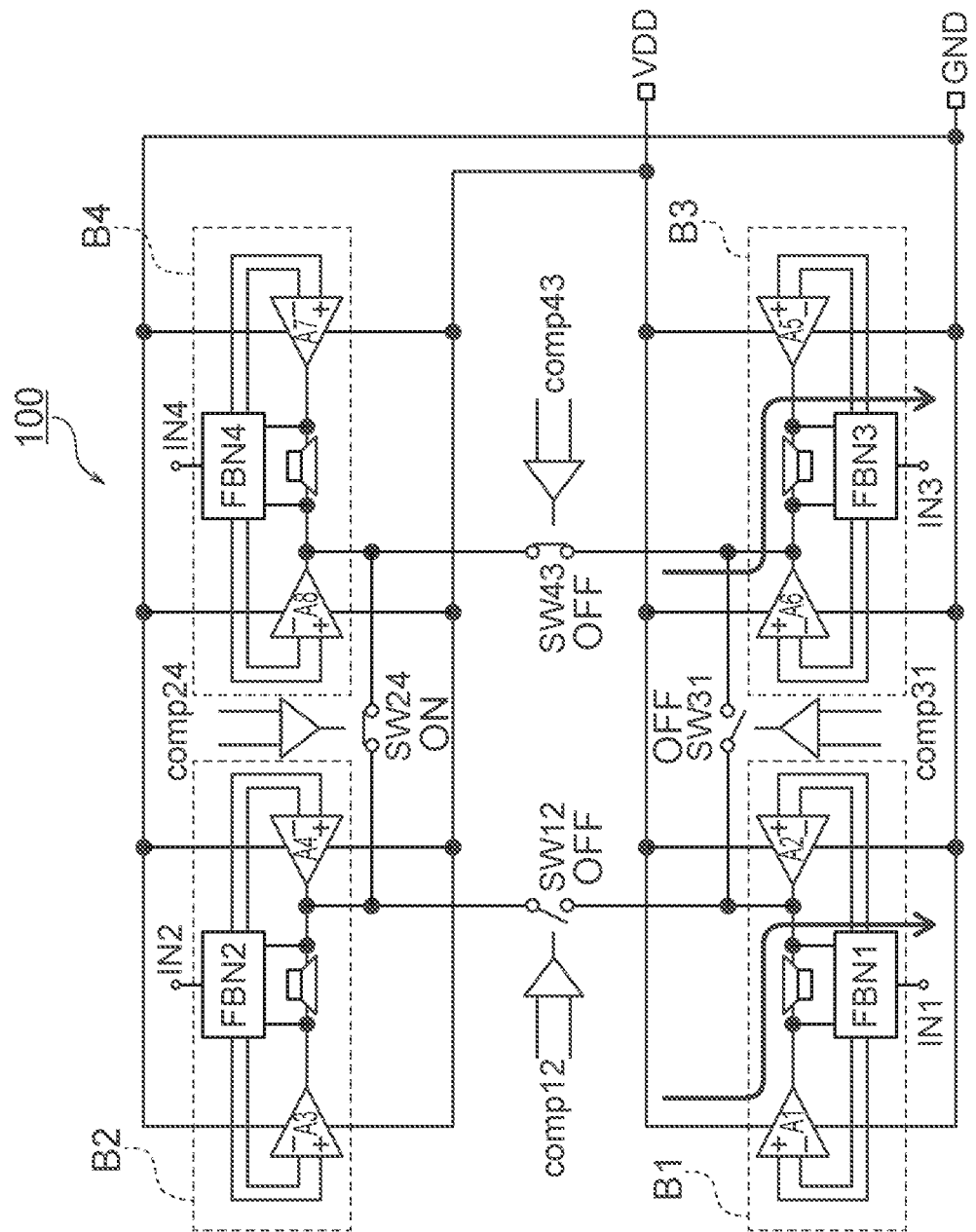
FIG. 17 is a diagram showing an example of an electric current flow at the time when the first BTL amplifier and the third BTL amplifier shown in FIG. 16 are in the large signal mode.

FIG. 17 is a diagram showing an example of an electric current flow at the time when the first BTL amplifier B1 and the third BTL amplifier B3 are in the large signal mode. The first BTL amplitude B1 and the third BTL amplitude B3 consume an electric current in each of channels, Therefore, power efficiency η is equivalent to power efficiency in the class-AB. However, a general sound signal involves zero-cross like a sine wave even if the general sound signal is a large signal. Accordingly, the first and third BTL amplifiers B1 and B3 transition to the large signal mode through the small signal mode in a high-efficiency state. Therefore, the power efficiency η for one cycle is improved compared with the power efficiency in the class-AB.

A flow of an electric current at the time when the third BTL amplifier B3 and the fourth BTL amplifier B4 are reproducing sound and the first BTL amplifier B1 and the second BTL amplifier B2 are not reproducing sound is explained with reference to FIGS. 18 and 19.

FIG. 18 is a diagram showing an example of an electric current flow at the time when the first to fourth BTL amplifiers B1 to 64 are in the small signal mode. A path of an electric current flowing to the third BTL amplifier B3 and the fourth BTL amplifier 64 is Ioa, Consequently, it is possible to reduce an electric current consumed by the power supply to a half of the consumed current (2×Ioa) of the normal class-AB amplifier and improve power efficiency.

Figure 19:
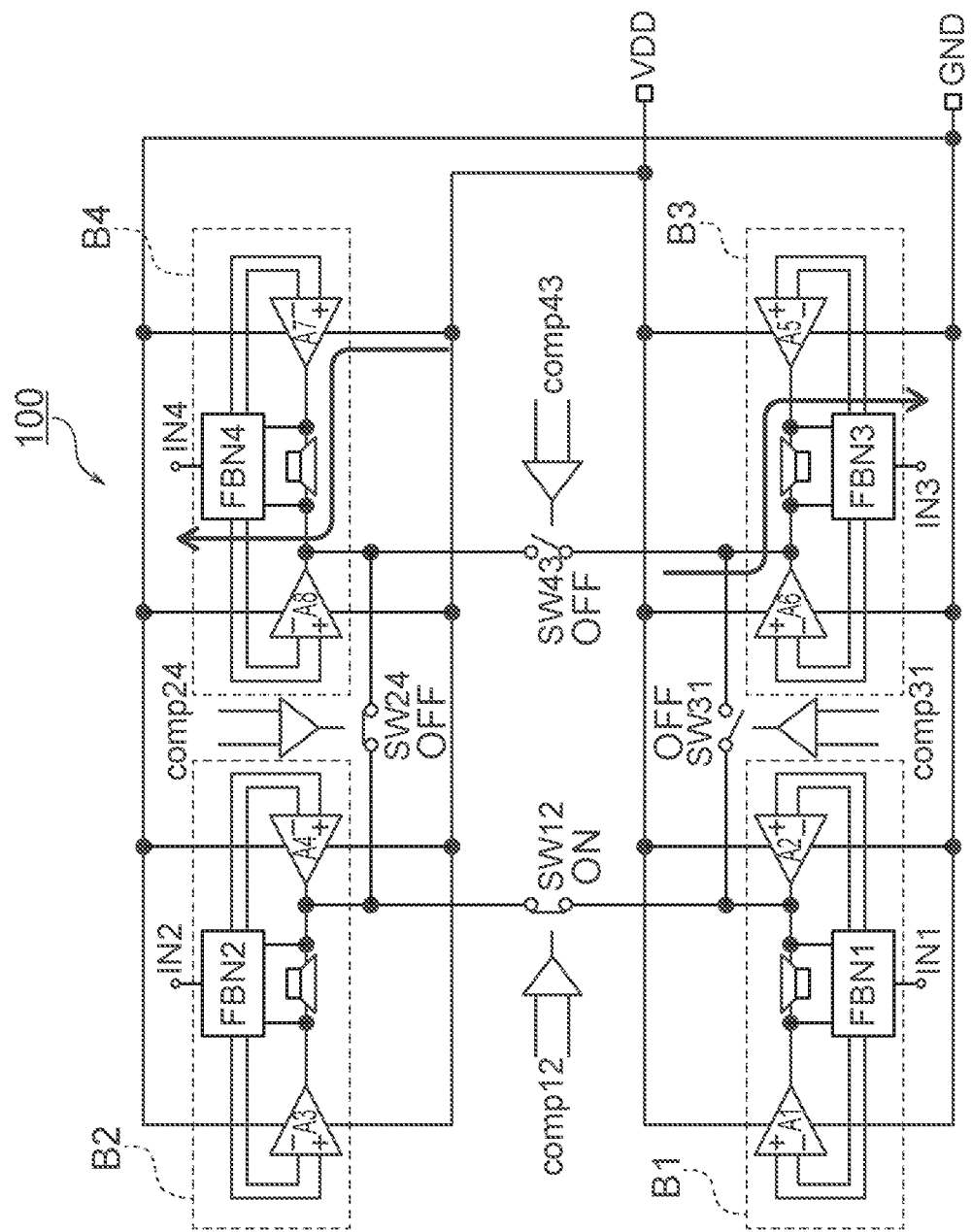
FIG. 19 is a diagram showing an example of an electric current flow at the time when the third BTL amplifier and the fourth BTL amplifier shown in FIG. 18 are in the large signal mode.

FIG. 19 is a diagram showing an example of an electric current flow at the time when the third BTL amplifier B3 and the fourth BTL amplifier B4 are in the large signal mode. The third BTL amplifier B3 and the fourth BTL amplifier B4 consume an electric current in each of channels. Therefore, the power efficiency is equivalent to the power efficiency in the class-AB. However, a general sound signal involves zero-cross like a sine wave even if the general sound signal is a large signal, Therefore, the third and fourth BTL amplifiers B3 and 64 transition to the large signal mode through the small signal mode in a high-efficiency state, Therefore, the power efficiency η for one cycle is improved compared with the power efficiency in the class-AB.

Figure 20:
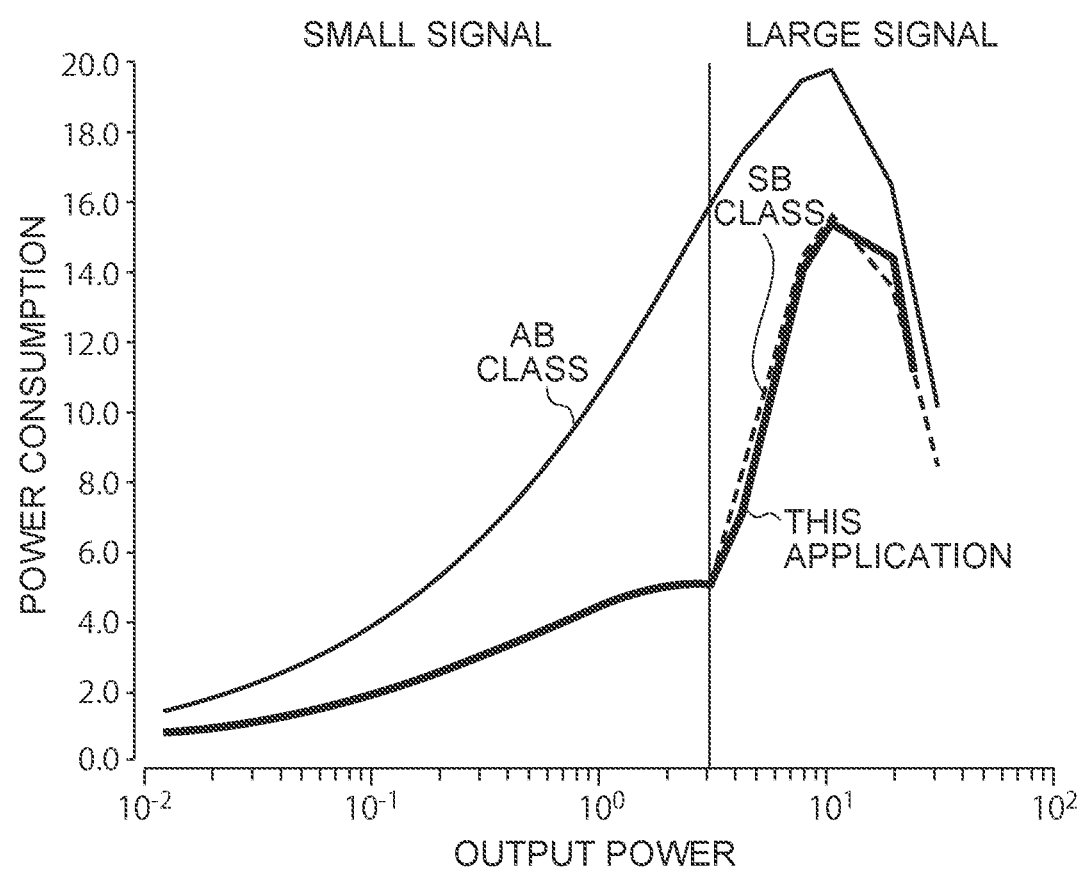
FIG. 20 is a diagram for comparing power consumption.

FIG. 20 is a diagram for comparing power consumptions. The horizontal axis indicates output power and the vertical axis indicates power consumption. In this embodiment, a characteristic of a lower power loss than the amplifiers of the class-AB and the class-SB is explained. In the small signal mode, power consumption is a half compared with the class-AB. A consumed current equivalent to a consumed current in the class-AB is generated in the large signal mode. However, in this embodiment, an output signal involves zero-cross like a sine wave even if the output signal is a large signal and transitions through the small signal mode. Therefore, entire power consumption is small compared with the class-AB.

As explained above, according to this embodiment, the closed loop section CL in which the first to fourth switch circuits SW12, SW24, SW31, and SW43 are connected in series is configured. The output terminal TA12 of the output amplifier A2 is connected to one end of the first switch circuit SW12, The output terminal TA22 of the output amplifier A4 is connected to one end of the second switch circuit SW24, The output terminal TA32 of the output amplifier A6 is connected to one end of the third switch circuit SW31, The output terminal TA42 of the output amplifier A8 is connected to one end of the fourth switch circuit SW43, Consequently, it is possible to feed the electric currents Ioa and Iob to loads of the first to fourth BTL amplifiers 61 to 64 connected to both ends of the switch circuits SW12, SW24, SW31, and SW43 that are on in the small signal mode. In this case, since the electric currents Ioa and Iob can be shared by the loads of the first to fourth BTL amplifiers B1 to 64, it is possible to further reduce power consumption.

When all of the switch circuits configuring the closed loop section CL are turned on, the remaining switch circuits are connected in parallel to both ends of one switch circuit. The resistance at both ends of the switch circuits decreases. Accordingly, a loss that occurs in one switch circuit is ¾Rsw×Ioa. The loss can be reduced to smaller than a loss Rsw×Ioa that occurs in a technique for performing bridging only with one switch circuit as in the general power amplifier circuit. Consequently, it is possible to further reduce a power capacity of the switch circuits configuring the closed loop section CL.

Modification of the Embodiment

Figure 21:
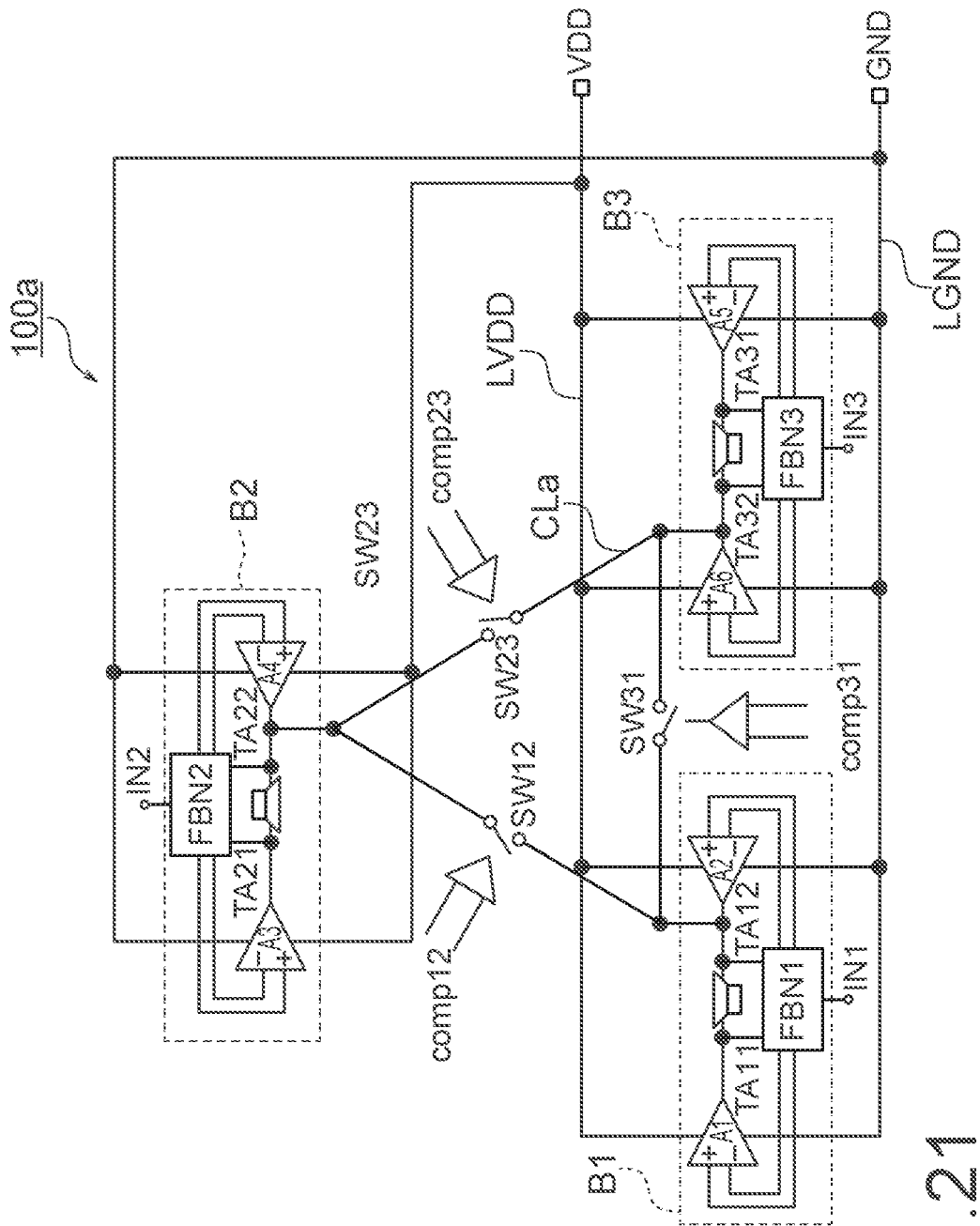
FIG. 21 is a configuration diagram showing an example of an audio system including a power amplifying device according to a modification.

FIG. 21 is a configuration diagram showing an example of an audio system including a power amplifying device 100*a* according to a modification of the embodiment. The power amplifying device 100a is different from the power amplifying device 100 shown in FIG. 1 in that a closed loop section CLa is configured by first to third switch circuits SW12, SW23, and SW31. Differences from the first embodiment are explained below. The power amplifying device 100a includes the first potential line LVDD, the second potential line LG D, the first to third BTL amplifiers B1 to B3, the closed loop section CLa, and the first to third comparators Comp12, Comp23, and Comp31.

The closed loop section CLa includes the first to third switch circuits SW12, SW23, and SW31 connected in series and is capable of forming a closed loop. The output terminal TA12 of the output amplifier A2 is connected to one end of the first switch circuit SW12. The output terminal TA22 of the output amplifier A4 is connected to the other end of the first switch circuit SW12, The output terminal TA22 of the output amplifier A4 is connected to one end of the second switch circuit SW23, The output terminal TA32 of the output amplifier A6 is connected to the other end of the second switch circuit SW23, The output terminal TA32 of the output amplifier A6 is connected to one end of the third switch circuit SW31, The output terminal TA12 of the output amplifier A2 is connected to the other end of the third switch circuit SW31. Note that, in this modification, the power amplifying device and the closed loop section CLa are configured by the three BTL amplifiers B1 to B3. However, the number of channels is not limited to this. For example, the power amplifying device and the closed loop section CLa may be configured by four or more BTL amplifiers.

A flow of an electric current at the time when the first BTL amplifier B1 and the second BTL amplifier B2 are reproducing sound and the third BTL amplifier 63 is not reproducing sound is explained with reference to FIGS. 22 and 23.

Figure 22:
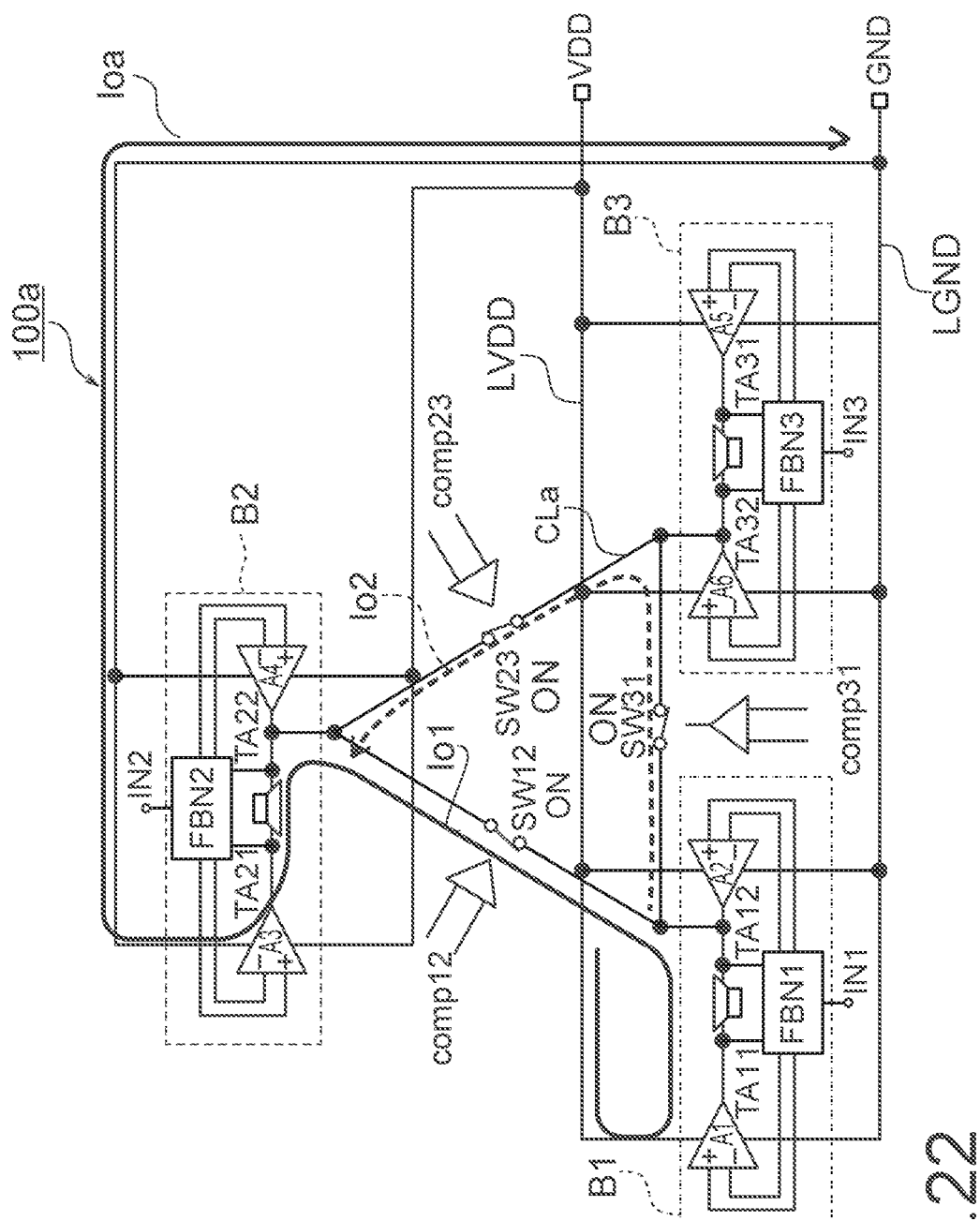
FIG. 22 is a diagram showing an example of an electric current flow at the time when a first BTL amplifier and a second BTL amplifier according to the modification are reproducing sound.

FIG. 22 is a diagram showing an example of an electric current flow at the time when the first to fourth BTL amplifiers B1 to 63 are in the small signal mode. The first and second input signals are inputs having the positive polarity. When bridge output signals in the first BTL amplifier B1 and the second BTL amplifier 62 have the same phase and the same amplitude, paths of electric currents flowing to the first BTL amplifier B1 and the second BTL amplifier B2 are Io1 and Io2. An electric current consumed by the power supply is Ioa (Io1+Io2). That is, by sharing the bridge output current Ioa of the first BTL amplifier B1 and the second BTL amplifier B2, it is possible to reduce the consumed current (2×Ioa) of the normal class-AB amplifier to a half and improve power efficiency.

In this case, the switch circuits SW12, SW23, and SW31 are turned on and are connected to the closed loop section CL in series in a loop shape. Therefore, the switch circuit SW12 and each of the switch circuits SW23 and SW31 are connected in parallel at both ends. When resistance values of the switch circuits W12, SW23, and SW31 are respectively represented as Rsw, a resistance value at both ends of the switch circuit SW12 is ⅔Rsw. Consequently, a loss that occurs in the switch circuits SW12, SW23, and SW31 is ⅔Rsw×Ioa. The loss can be reduced to smaller than the loss Rsw×Io that occurs in the technique for performing bridging only with the switch circuit SW12 as in the general power supply amplifier circuit.

Figure 23:
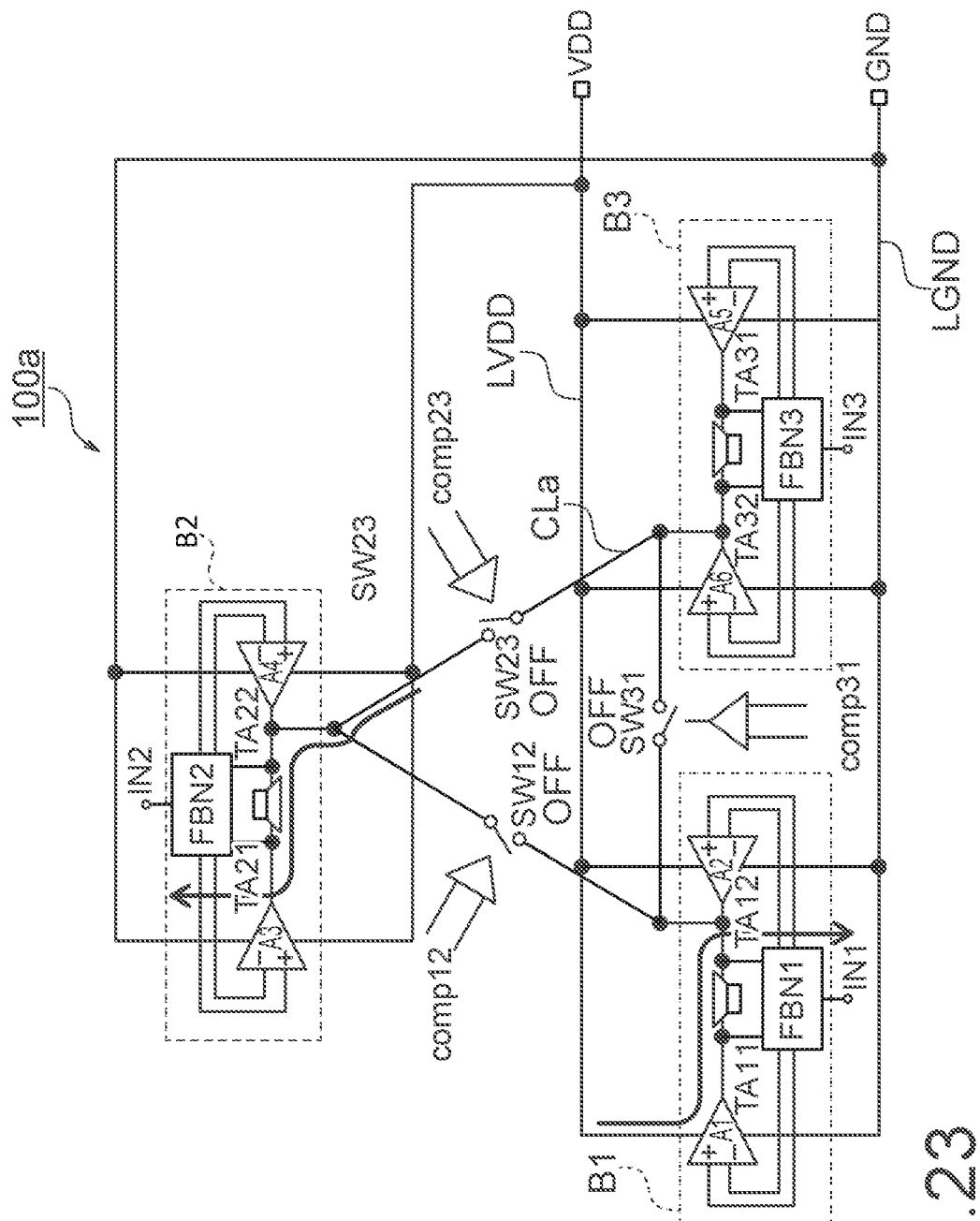
FIG. 23 is a diagram showing an example of an electric current flow at the time when the first BTL amplifier and the second BTL amplifier shown in FIG. 22 are in the large signal mode.

FIG. 23 is a diagram showing an example of electric current flow at the time when the first BTL amplifier B1 and the second BTL amplifier B2 are in the large signal mode. Since the first and second BTL amplifiers B1 and 62 consume an electric current in each of channels. Therefore, the power efficiency r is equivalent to the power efficiency in the class-AB. However, a general sound signal involves zero-cross like a sine wave even if the general sound signal is a large signal. Accordingly, the first and second BTL amplifiers B1 and B2 transition to the large signal mode through the small signal mode in a high-efficiency state. Therefore, the power efficiency η for one cycle is improved compared with the power efficiency in the class-AB.

As explained above, according to this modification, the closed loop section CLa is configured by connecting the three or more switch circuits in series. The output terminal of the output amplifier is connected to one end of the switch circuit corresponding thereto. Consequently, when all of the switch circuits configuring the closed loop section CLa are turned on, the remaining switch circuits are connected in parallel to both ends of one switch circuit. The resistance at both ends of the switch circuits decreases. Accordingly, a loss that occurs in one switch circuit can be reduced to smaller than a loss that occurs in the technique for performing bridging only with one switch circuit as in the general power supply amplifier circuit. Consequently, it is possible to further reduce a power capacity of the switch circuits.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A power amplifying device comprising:
   three or more BTL amplifiers including a first output amplifier and a second output amplifier bridge-connected to each other, the three or more BTL amplifiers outputting an output signal obtained by amplifying an input signal; and
   a closed loop section in which a plurality of switch circuits respectively corresponding to the three or more BTL amplifiers are connected in series, the closed loop section being capable of forming a closed loop, wherein
   an output terminal of the second output amplifier is connected to one end of the corresponding switch circuit, and
   the switch circuit is turned on to establish connection between output terminals of two BTL amplifiers connected to both ends and is turned off to break the connection between the output terminals, wherein
   in a case that each of the plurality of switch circuits is turned on, the closed loop is formed.

2. The power amplifying device according to claim 1, wherein, when amplitude of an input signal in each of the three or more BTL amplifiers is smaller than a first threshold, all of the plurality of switch circuits are turned on.

3. The power amplifying device according to claim 1 or 2, wherein each of the plurality of switch circuits is turned off when at least one of amplitudes of input signals in two BTL amplifiers connected to both ends is equal to or larger than the first threshold.

4. The power amplifying device according to claim 3, wherein
   each of the plurality of BTL amplifiers is connected between a first potential line to which first potential is supplied and a second potential line to which second potential lower than the first potential is supplied, the first threshold corresponds to input signals of the respective plurality of BTL amplifiers when amplitudes of output signals of the respective plurality of BTL amplifiers are a half of a potential difference between the first potential and the second potential, and when the amplitudes of the output signals of the respective plurality of BTL amplifiers are smaller than the first threshold, the amplitudes of the output signals of the respective plurality of BTL amplifiers are set to be smaller than a half of the potential difference between the first potential and the second potential.

5. The power amplifying device according to claim 4, further comprising a plurality of comparators configured to, when the amplitudes of the respective input signals in the two BTL amplifiers connected to both ends of the switch circuit is smaller than the first threshold, output a signal for turning on the switch circuit and, on the other hand, when the amplitude of at least one of the first and second input signals is equal to or larger than the first threshold, output a signal for turning off the switch circuit.

6. The power amplifying device according to any one of claims 1 to 5, further comprising a plurality of control circuits corresponding to the respective plurality of BTL amplifiers and configured to control outputs of the first output amplifier and the second output amplifier according to the input signals.

7. The power amplifying device according to claim 6, wherein each of the control circuits controls gains of the first output amplifier and the second output amplifier such that a differential gain of the BTL amplifier of an output signal with respect to the input signal corresponding thereto is a prescribed value.

8. The power amplifying device according to claim 7, wherein
the control circuit includes:
a differential output circuit, to an input of which an input signal is input, the differential output circuit outputting a differential signal based on the input signal from a first output and a second output;
a first resistor, one end of which is connected to the first output of the differential output circuit and another end of which is connected to a first positive-phase input of the first output amplifier and connected to a first reverse-phase input of the second output amplifier;
a second resistor, one end of which is connected to the second output of the differential output circuit and another end of which is connected to a first positive-phase input of the second output amplifier and connected to a first reverse-phase input of the first output amplifier;
a third resistor, one end of which is connected to the other end of the first resistor and another end of which is connected to the output terminal of the second output amplifier;
a fourth resistor, one end of which is connected to the other end of the second resistor and another end of which is connected to an output terminal of the first output amplifier;
a fifth resistor, one end of which is connected to the output of the first output amplifier and another end of which is connected to a second reverse-phase input of the first output amplifier and a second reverse-phase input of the second output amplifier;

an eighth resistor, one end of which is connected to the output of the second output amplifier and another end of which is connected to the other end of the fifth resistor;

a first control switch, one end of a current path of which is connected to the other end of the fifth resistor and another end of the current path of which is connected to a second positive-phase input of the first output amplifier and connected to a second positive-phase input of the second output amplifier, the first control switch being turned on and off in synchronization with the first switch circuit;

a capacitor, to one end of which a reference voltage is supplied and another end of which is connected to the other end of the current path of the first control switch;

a sixth resistor, one end of which is connected to a feedback terminal and another end of which is connected to a third reverse-phase input of the first output amplifier and a third reverse-phase input of the second output amplifier;

a second control switch, one end of a current path of which is connected to the other end of the sixth resistor and another end of the current path of which is connected to a third positive-phase input of the first output amplifier and connected to a third positive-phase input of the second output amplifier, the second control switch being turned on or off complementarily to the first control switch; and a seventh resistor, to one end of which the reference voltage is supplied and another end of which is connected to the other end of the current path of the second control switch, the first output amplifier outputs, from the output terminal, signals corresponding to a potential difference between the first positive-phase input and the first reverse-phase input, a potential difference between the second positive-phase input and the second reverse-phase input, and a potential difference between the third positive-phase input and the third reverse-phase input of the first output amplifier, and the second output amplifier outputs, from the output terminal, signals corresponding to a potential difference between the first positive-phase input and the first reverse-phase input, a potential difference between the second positive-phase input and the second reverse-phase input, and a potential difference between the third positive-phase input and the third reverse-phase input of the second output amplifier.

9. The power amplifying device according to claim 8, wherein the feedback terminals of the respective plurality of control circuits are connected to one another.

10. The power amplifying device according to claim 8, wherein
the first output amplifier includes:
a first MOS transistor, one end of a current path of which is connected to a current supply terminal and another end of the current path of which is connected to an output terminal; and
a second MOS transistor, one end of the current path of which is connected to an output terminal and another end of the current path of which is connected to a current sweep-out terminal, and
the first MOS transistor and the second MOS transistor are controlled to be turned on or off complementarily according to the potential difference between the first positive-phase input and the first reverse-phase input, the potential difference between the second positive-phase input and the second reverse-phase input, and the potential difference between the third positive-phase input and the third reverse-phase input.

11. An audio system comprising:
a plurality of speakers; and
a power amplifying device, wherein
the power amplifying device includes:
three or more BTL amplifiers including a first output amplifier and a second output amplifier bridge-connected to each other, the three or more BTL amplifiers outputting an output signal obtained by amplifying an input signal to one of the plurality of speakers; and
a closed loop section in which a plurality of switch circuits respectively corresponding to the three or more BTL amplifiers are connected in series, the closed loop section being capable of forming a closed loop, and
an output terminal of the second output amplifier is connected to one end of the corresponding switch circuit, and
the switch circuit is turned on to establish connection between output terminals of two BTL amplifiers connected to both ends and is turned off to break the connection of the output terminals in a case that all of the plurality of switch circuits are turned on, wherein
in a case that each of the plurality of switch circuits is turned on, the closed loop is formed.

12. The audio system according to claim 11, wherein, when amplitude of an input signal in each of the three or more BTL amplifiers is smaller than a first threshold, all of the plurality of switch circuits are turned on.

13. The audio system according to claim 11, wherein each of the plurality of switch circuits is turned off when at least one of amplitudes of input signals in two BTL amplifiers connected to both ends is equal to or larger than the first threshold.

14. The audio system according to claim 13, wherein
each of the plurality of BTL amplifiers is connected between a first potential line to which first potential is supplied and a second potential line to which second potential lower than the first potential is supplied,
the first threshold corresponds to input signals of the respective plurality of BTL amplifiers when amplitudes of output signals of the respective plurality of BTL amplifiers are a half of a potential difference between the first potential and the second potential, and
when the amplitudes of the output signals of the respective plurality of BTL amplifiers are smaller than the first threshold, the amplitudes of the output signals of the respective plurality of BTL amplifiers are set to be smaller than a half of the potential difference between the first potential and the second potential.

15. The audio system according to claim 14, further comprising a plurality of comparators configured to, when the amplitudes of the respective input signals in the two BTL amplifiers connected to both ends of the switch circuit is smaller than the first threshold, output a signal for turning on the switch circuit and, on the other hand, when the amplitude of at least one of the first and second input signals is equal to or larger than the first threshold, output a signal for turning off the switch circuit.

16. The audio system according to claim 11, further comprising a plurality of control circuits corresponding to the respective plurality of BTL amplifiers and configured to control outputs of the first output amplifier and the second output amplifier according to the input signals.

17. The audio system according to claim 16, wherein each of the control circuits controls gains of the first output amplifier and the second output amplifier such that a differential gain of the BTL amplifier of an output signal with respect to the input signal corresponding thereto is a prescribed value.

18. The audio system according to claim 17, wherein the control circuit includes:
a differential output circuit, to an input of which an input signal is input, the differential output circuit outputting a differential signal based on the input signal from a first output and a second output;
a first resistor, one end of which is connected to the first output of the differential output circuit and another end of which is connected to a first positive-phase input of the first output amplifier and connected to a first reverse-phase input of the second output amplifier;
a second resistor, one end of which is connected to the second output of the differential output circuit and another end of which is connected to a first positive-phase input of the second output amplifier and connected to a first reverse-phase input of the first output amplifier;
a third resistor, one end of which is connected to the other end of the first resistor and another end of which is connected to the output terminal of the second output amplifier;
a fourth resistor, one end of which is connected to the other end of the second resistor and another end of which is connected to an output terminal of the first output amplifier;
a fifth resistor, one end of which is connected to the output of the first output amplifier and another end of which is connected to a second reverse-phase input of the first output amplifier and a second reverse-phase input of the second output amplifier;
an eighth resistor, one end of which is connected to the output of the second output amplifier and another end of which is connected to the other end of the fifth resistor;
a first control switch, one end of a current path of which is connected to the other end of the fifth resistor and another end of the current path of which is connected to a second positive-phase input of the first output amplifier and connected to a second positive-phase input of the second output amplifier, the first control switch being turned on and off in synchronization with the first switch circuit;
a capacitor, to one end of which a reference voltage is supplied and another end of which is connected to the other end of the current path of the first control switch;
a sixth resistor, one end of which is connected to a feedback terminal and another end of which is connected to a third reverse-phase input of the first output amplifier and a third reverse-phase input of the second output amplifier;
a second control switch, one end of a current path of which is connected to the other end of the sixth resistor and another end of the current path of which is connected to a third positive-phase input of the first output amplifier and connected to a third positive-phase input of the second output amplifier, the second control switch being turned on or off complementarily to the first control switch; and
a seventh resistor, to one end of which the reference voltage is supplied and another end of which is connected to the other end of the current path of the second control switch, the first output amplifier outputs, from the output terminal, signals corresponding to a potential difference between the first positive-phase input and the first reverse-phase input, a potential difference between the second positive-phase input and the second reverse-phase input, and a potential difference between the third positive-phase input and the third reverse-phase input of the first output amplifier, and the second output amplifier outputs, from the output terminal, signals corresponding to a potential difference between the first positive-phase input and the first reverse-phase input, a potential difference between the second positive-phase input and the second reverse-phase input, and a potential difference between the third positive-phase input and the third reverse-phase input of the second output amplifier.

19. The audio system according to claim 18, wherein the feedback terminals of the respective plurality of control circuits are connected to one another.

20. The audio system according to claim 18, wherein the first output amplifier includes:

a first MOS transistor, one end of a current path of which is connected to a current supply terminal and another end of the current path of which is connected to an output terminal; and a second MOS transistor, one end of the current path of which is connected to an output terminal and another end of the current path of which is connected to a current sweep-out terminal, and the first MOS transistor and the second MOS transistor are controlled to be turned on or off complementarily according to the potential difference between the first positive-phase input and the first reverse-phase input, the potential difference between the second positive-phase input and the second reverse-phase input, and the potential difference between the third positive-phase input and the third reverse-phase input of the first output amplifier.

* * * * *